United States Patent
Kodama

(10) Patent No.: US 9,684,233 B2
(45) Date of Patent: Jun. 20, 2017

(54) CURABLE COMPOSITION FOR IMPRINTS, PATTERNING METHOD AND PATTERN

(75) Inventor: Kunihiko Kodama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 381 days.

(21) Appl. No.: 13/509,209

(22) PCT Filed: Nov. 10, 2010

(86) PCT No.: PCT/JP2010/070417
§ 371 (c)(1),
(2), (4) Date: May 10, 2012

(87) PCT Pub. No.: WO2011/059104
PCT Pub. Date: May 19, 2011

(65) Prior Publication Data
US 2012/0225263 A1    Sep. 6, 2012

(30) Foreign Application Priority Data

Nov. 10, 2009 (JP) ................. 2009-256702

(51) Int. Cl.
| | |
|---|---|
| *B32B 3/10* | (2006.01) |
| *C08F 2/46* | (2006.01) |
| *C08L 83/00* | (2006.01) |
| *G03F 7/00* | (2006.01) |
| *B82Y 10/00* | (2011.01) |
| *B82Y 40/00* | (2011.01) |
| *C08F 220/22* | (2006.01) |
| *C08F 220/30* | (2006.01) |
| *C08F 230/08* | (2006.01) |
| *G03F 7/004* | (2006.01) |
| *G03F 7/027* | (2006.01) |
| *G03F 7/075* | (2006.01) |
| *C08F 222/10* | (2006.01) |

(52) U.S. Cl.
CPC ............ *G03F 7/0002* (2013.01); *B82Y 10/00* (2013.01); *B82Y 40/00* (2013.01); *C08F 220/22* (2013.01); *C08F 220/30* (2013.01); *C08F 230/08* (2013.01); *G03F 7/0046* (2013.01); *G03F 7/027* (2013.01); *G03F 7/0755* (2013.01); *C08F 222/1006* (2013.01); *Y10T 428/24802* (2015.01)

(58) Field of Classification Search
CPC .................................................. G03F 7/0002
See application file for complete search history.

(56) References Cited

U.S. PATENT DOCUMENTS

| | | | |
|---|---|---|---|
| 5,032,108 A | 7/1991 | Taniguchi et al. | |
| 5,169,965 A | 12/1992 | Fujiwa et al. | |
| 5,198,509 A | 3/1993 | Fujiwa et al. | |
| 5,259,926 A | 11/1993 | Kuwabara et al. | |
| 5,338,879 A | 8/1994 | Fujiwa et al. | |
| 5,378,736 A | 1/1995 | Fujiwa et al. | |
| 5,772,905 A | 6/1998 | Chou | |
| 5,956,216 A | 9/1999 | Chou | |
| 6,916,584 B2 | 7/2005 | Sreenivasan et al. | |
| 7,027,156 B2 | 4/2006 | Watts et al. | |
| 7,070,405 B2 | 7/2006 | Sreenivasan et al. | |
| 7,198,968 B2 | 4/2007 | Chae et al. | |
| 7,821,586 B2 | 10/2010 | Kim | |
| 7,883,764 B2 | 2/2011 | Murao | |
| 2004/0021254 A1 | 2/2004 | Sreenivasan et al. | |
| 2005/0142714 A1 | 6/2005 | Chae et al. | |
| 2005/0231669 A1 | 10/2005 | Kim | |
| 2006/0158651 A1 | 7/2006 | Watts et al. | |
| 2007/0264591 A1 | 11/2007 | Wuister et al. | |
| 2007/0298176 A1* | 12/2007 | DiPietro et al. | ............... 427/355 |
| 2008/0139769 A1* | 6/2008 | Iwamoto | .................. C07C 67/08 526/259 |
| 2008/0167396 A1 | 7/2008 | Murao | |
| 2008/0277826 A1* | 11/2008 | Chou et al. | .................... 264/293 |
| 2011/0003909 A1* | 1/2011 | Fujita et al. | ................... 522/182 |

FOREIGN PATENT DOCUMENTS

| | | |
|---|---|---|
| EP | 2 159 236 A1 | 3/2010 |
| JP | 11-100378 A | 4/1999 |
| JP | 2906245 B2 | 6/1999 |
| JP | 2926262 B2 | 7/1999 |
| JP | 2004-240241 A | 8/2004 |
| JP | 2005-197699 A | 7/2005 |
| JP | 2005-301289 A | 10/2005 |
| JP | 2006-114882 A | 4/2006 |
| JP | 2007-091870 A | 4/2007 |
| JP | 2008095037 A | 4/2008 |
| JP | 2009181107 A * | 8/2009 |
| JP | 2009-203287 A | 9/2009 |
| JP | 2009-214323 A | 9/2009 |
| JP | 2009-215179 A | 9/2009 |
| WO | 2004/013693 A2 | 2/2004 |
| WO | 2005/040238 A1 | 6/2005 |
| WO | WO 2009110496 A1 * | 9/2009 |
| WO | 2010/050614 A1 | 5/2010 |
| WO | 2010/064726 A2 | 6/2010 |
| WO | 2010/104188 A1 | 9/2010 |
| WO | 2011/040635 A1 | 4/2011 |

OTHER PUBLICATIONS

"Experimental and Theoretical Investigation on Surfactant Segregation in Imprint Lithography," Wu et al., 2007, Langmuir, 23, 1166-1170.*

(Continued)

*Primary Examiner* — Ian Rummel
(74) *Attorney, Agent, or Firm* — Sughrue Mion, PLLC

(57) ABSTRACT

A curable composition for imprints, containing (A1) a polymerizable compound having at least one of a fluorine atom and a silicon atom, (A2) a polymerizable compound having an aromatic group and (B) a photopolymerization initiator, exhibits good patternability in repeated pattern transferring and solvent resistance.

16 Claims, No Drawings

(56) References Cited

OTHER PUBLICATIONS

Translation of JP 2009181107 A.*
S. Chou, et al., "Imprint of Sub-25 nm vias and Trenches in Polymers", Applied Physics Letters, 1995, pp. 3114-3116, vol. 67, Issue 21.
Lecture of Experimental Chemistry 20, 4th Ed., Organic Synthesis II, pp. 213-225 ff. (1992, Maruzen).
Yoshimura, "Technology on Adhesion and Sealing," 1985, pp. 32-39, vol. 29, No. 12.
Yoshimura, "Technology on Adhesion and Sealing", 1986, pp. 42-47, vol. 30, No. 5.
Yoshimura, "Technology on Adhesion and Sealing", 1986, pp. 42-47, vol. 30, No. 7.
Lapin S. C., "Vinyl Ether Functionalized Urethane Oligomers: An Alternative to Acrylate Based Systems", Polymers Paint Colour Journal, 1989, pp. 321-328, vol. 179, No. 4237.
The Chemistry of Heterocyclic Compounds—Small Ring Heterocycles, Part 3, Oxiranes (edited by Alfred Hassner, John Wiley and Sons, An Interscience Publication, New York) 1985, vol. 42.
International Search Report of PCT/JP2010/070417 dated Feb. 22, 2011.
M. Colburn, et al., "Step and Flash Imprint Lithography: A New Approach to High-Resolution Patterning", Proc. SPIE, 1999, pp. 379-389, vol. 3676.
International Preliminary Report on Patentability dated May 24, 2012 for PCT/JP2010/070417.
Extended European Search Report dated Sep. 10, 2013 in European Application No. 10830060.9.
Office Action dated Jun. 3, 2014, from the Japanese Patent Office in Japanese application No. 2010-248136.
Office Action dated Aug. 19, 2014 in Taiwan Patent Application No. 099138680.
Office Action dated Dec. 16, 2015, issued by the Korean Intellectual Property Office in corresponding Korean Application No. 10-2012-7014745.

\* cited by examiner

CURABLE COMPOSITION FOR IMPRINTS, PATTERNING METHOD AND PATTERN

CROSS REFERENCE TO RELATED APPLICATIONS

This application is a National Stage of International Application No. PCT/JP2010/070417 filed Nov. 10, 2010, claiming priority based on Japanese Patent Application No. 2009-256702 filed Nov. 10, 2009, the contents of all of which are incorporated herein by reference in their entirety.

TECHNICAL FIELD

The present invention relates to a curable composition for imprints. More precisely, the invention relates to a curable composition for micropatterning to give imprints through photoirradiation, which is used in producing magnetic recording media such as semiconductor integrated circuits, flat screens, microelectromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

BACKGROUND ART

Imprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of imprint technology have been proposed; one is a thermal imprint method using a thermoplastic resin as the material to be worked (for example, see S. Chou, et al., Appl. Phys. Lett. Vol. 67, 3114 (1995)), and the other is a photoimprint method using a photocurable composition (for example, see M. Colbun, et al., Proc. SPIE, Vol. 3676, 379 (1999)). In the thermal imprint method, a mold is pressed against a polymer resin heated up to a temperature not lower than the glass transition temperature thereof, then the resin is cooled and thereafter released from the mold to thereby transfer the microstructure of the mold onto the resin on a substrate. The method is applicable to various resin materials and glass materials and is expected to be applicable to various fields. For example, U.S. Pat. Nos. 5,772,905 and 5,956,216 disclose an imprint method of forming nanopatterns inexpensively.

On the other hand, in the photoimprint method where a composition for photoimprints is photocured by photoirradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the imprint methods as above, proposed are applied technologies to nano-scale mentioned below.

In the first technology, the molded pattern itself has a function, and is applied to various elements in nanotechnology and to structural members. Its examples include various micro/nano optical elements and high-density recording media, as well as structural members in optical films, flat panel displays, etc. The second technology is for hybrid-molding of microstructures and nanostructures, or for construction of laminate structures through simple interlayer positioning, and this is applied to production of μ-TAS (micro-total analysis system) and biochips. In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned imprint technologies and their applied technologies has become active for practical use thereof.

As one example of imprint technology, hereinunder described is an application to production of high-density semiconductor integrated circuits. The recent development in micropatterning and integration scale enlargement in semiconductor integrated circuits is remarkable, and high-definition photolithography for pattern transfer for realizing the intended micropatterning is being much promoted and advanced in the art. However, for further requirement for more definite micropatterning to a higher level, it is now difficult to satisfy all the three of micropattern resolution, cost reduction and throughput increase. Regarding this, as a technology of micropatterning capable of attaining at a low cost, imprint lithography, particularly nanoimprint lithography (photonanoimprint method) is proposed. For example, U.S. Pat. Nos. 5,772,905 and 5,259,926 disclose a nanoimprint technology of using a silicon wafer as a stamper for transferring a microstructure of at most 25 nm. This application requires micropatternability on a level of a few tens nm and high-level etching resistance of the micropattern functioning as a mask in substrate processing.

An application example of imprint technology to production of next-generation hard disc drives (HDD) is described. Based on head performance improvement and media performance improvement closely connected with each other, the course of HDD history is for capacity increase and size reduction. From the viewpoint of media performance improvement, HDD has realized increased large-scale capacity as a result of the increase in the surface-recording density thereon. However, in increasing the recording density, there occurs a problem of so-called magnetic field expansion from the side surface of the magnetic head. The magnetic field expansion could not be reduced more than a certain level even though the size of the head is reduced, therefore causing a phenomenon of so-called sidelight. The sidelight, if any, causes erroneous writing on the adjacent tracks and may erase the already recorded data. In addition, owing to the magnetic field expansion, there may occur another problem in that superfluous signals may be read from the adjacent track in reproduction. To solve these problems, there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of imprint technology is proposed. The application also requires micropatternability on a level of a few tens nm and high-level etching resistance of the micropattern functioning as a mask in substrate processing.

Next described is an application example of imprint technology to flat displays such as liquid-crystal displays (LCD) and plasma display panels (PDP).

With the recent tendency toward large-sized LCD substrates and PDP substrates for high-definition microprocessing thereon, photoimprint lithography has become specifically noted these days as an inexpensive lithography technology capable of being substituted for conventional photolithography for use in production of thin-film transistors (TFT) and electrode plates. Accordingly, it has become necessary to develop a photocurable resist capable of being substituted for the etching photoresist for use in conventional photolithography.

Further, for the structural members for LCD and others, application of photoimprint technology to transparent protective film materials described in JP-A-2005-197699 and 2005-301289, or to spacers described in JP-A-2005-301289 is being under investigation. Differing from the above-mentioned etching resist, the resist for such structural members finally remains in displays, and therefore, it may be referred to as "permanent resist" or "permanent film".

The spacer to define the cell gap in liquid-crystal displays is also a type of the permanent film; and in conventional photolithography, a photocurable composition comprising a resin, a photopolymerizable monomer and an initiator has been generally widely used for it (for example, see JP-A-2004-240241). In general, the spacer is formed as follows: After a color filter is formed on a color filter substrate, or after a protective film for the color filter is formed, a photocurable composition is applied thereto, and a pattern having a size of from 10 μm or 20 μm or so is formed through photolithography, and this is further thermally cured through past-baking to form the intended spacer.

Further, imprint lithography is useful also in formation of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

In application to such permanent films, the formed pattern remains in the final products, and is therefore required to have high-level properties of mainly film durability and strength, including heat resistance, light resistance, solvent resistance, scratch resistance, high-level mechanical resistance to external pressure, hardness, etc.

Almost all patterns heretofore formed in conventional photolithography can be formed in imprint technology, which is therefore specifically noted as a technology capable of forming micropatterns inexpensively.

In industrial use of nanoimprinting, it is important to show a good patternability and additionally the feature suitable to the use. For example, in the use of processing a substrate, etching resistance, patterning accuracy after etching, solvent resistance, etc. are required. In particular, especially for large-scale mass-production, yield increase is required in continuous patterning, or that is, good patternability is required in repeated pattern transferring. In addition, improvement of solvent resistance of the formed pattern is required, that is, when the formed pattern is in contact with a solvent in a following step, its shape and thickness are required to be unchanged.

JP-A 2006-114882 discloses use of a photocurable composition containing a fluoromonomer in nanoimprinting, saying that the composition has good patternability.

SUMMARY OF THE INVENTION

The present inventors used the composition described in JP-A 2006-114882 in repeated pattern transferring, and found that the problem of worsening the patternability and the problem of changing the thickness when the pattern is in contact with a solvent were not still improved.

An object of the invention is to solve the above-mentioned problems. Specifically, the object of the invention is to provide a curable composition for imprints that exhibits good patternability even in repeated pattern transferring and good solvent resistance of the cured pattern, to provide a patterning method that uses it, and to provide the pattern formed according to the patterning method.

Given the situation as above, the inventors have assiduously studied and, as a result, have found that the above-mentioned problems can be solved by the following means:

[1] A curable composition for imprints, comprising (A) a polymerizable compound and (B) a photopolymerization initiator, wherein the polymerizable compound (A) comprises (A1) a polymerizable compound having at least one of a fluorine atom and a silicon atom and (A2) a polymerizable compound having an aromatic group.

[2] The curable composition for imprints of [1], wherein 50% by mass or more of the polymerizable compound (A) is a polyfunctional polymerizable compound having two or more polymerizable functional groups in the molecule.

[3] The curable composition for imprints of [1] or [2], wherein 20% by mass or more of the polymerizable compound (A) is a polyfunctional polymerizable compound having two or more polymerizable functional groups and an aromatic group in the molecule.

[4] The curable composition for imprints of any one of [1] to [3], wherein more than 90% by mass of the polymerizable compound (A) is a polymerizable compound having a viscosity of 300 mPa·s or less.

[5] The curable composition for imprints of any one of [1] to [4], wherein 80% by mass or more of the polymerizable compound (A) is a monomer having an aromatic group.

[6] The curable composition for imprints of any one of [1] to [5], wherein the polymerizable compound (A1) having at least one of a fluorine atom and a silicon atom is a polymerizable compound having a trifluoromethyl group structure.

[7] The curable composition for imprints of any one of [1] to [6], wherein the polymerizable compound (A1) having at least one of a fluorine atom and a silicon atom is a polymerizable compound having two or more fluorine-containing groups in a molecule.

[8] The curable composition for imprints of any one of [1] to [7], wherein the polymerizable compound (A1) having at least one of a fluorine atom and a silicon atom is a polymerizable compound having a fluorine content of from 20 to 60%.

[9] The curable composition for imprints of any one of [1] to [8], wherein the polymerizable compound (A1) having at least one of a fluorine atom and a silicon atom is a polymer having a fluorine atom and having a weight average molecular weight of from 2000 to 100000.

[10] The curable composition for imprints of any one of [1] to [9], wherein the polymerizable compound (A1) having at least one of a fluorine atom and a silicon atom is a monomer having a silicon atom.

[11] The curable composition for imprints of any one of [1] to [10], wherein the polymerizable compound (A2) having an aromatic group is an acrylate or a methacrylate.

[12] The curable composition for imprints of any one of [1] to [11], wherein the polymerizable compound (A2) having an aromatic group has a molecular weight of from 150 to 500.

[13] The curable composition for imprints of any one of [1] to [12], wherein the polymerizable compound (A2) having an aromatic group has a viscosity of from 2 to 300 mPa·s.

[14] The curable composition for imprints of any one of [1] to [13], wherein the polymerizable compound (A2) having an aromatic group is contained in an amount of 80% by mass or more in all the polymerizable compounds contained in the curable composition.

[15] A patterning method comprising applying the curable composition for imprints of any one of [1] to [14] onto a substrate to form a patterning layer thereon, pressing a mold against the surface of the patterning layer, and irradiating the patterning layer with light.

[16] A pattern formed according to the patterning method of [15].

The invention can provide a curable composition for imprints which exhibits good patternability even in repeated pattern transferring and good solvent resistance of the cured pattern.

MODES FOR CARRYING OUT THE INVENTION

The contents of the invention are described in detail hereinunder. In this specification, the numerical range expressed by the wording "a number to another number" means the range that falls between the former number indicating the lowermost limit of the range and the latter number indicating the uppermost limit thereof. In this specification, mass ratio is equal to weight ratio.

In this description, "(meth)acrylate" means acrylate and methacrylate; "(meth)acrylic" means acrylic and methacrylic; "(meth)acryloyl" means acryloyl and methacryloyl. In the invention, "monomer" is differentiated from oligomer and polymer, and the monomer indicates a compound having a weight-average molecular weight of at most 1,000. In this description, "polymerizable compound" means a compound having a polymerizable functional group, concretely, a compound having a group that participates in polymerization. "Imprint" referred to in the invention is meant to indicate pattern transfer in a size of from 1 nm to 10 mm, more preferably pattern transfer in a size of approximately from 10 nm to 100 µm (for nanoimprints).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

[Curable Composition for Imprints of the Invention]

The curable composition for imprints of the invention (hereinafter this may be simply referred to as "the curable composition of the invention") comprises a polymerizable compound (A) and a photopolymerization initiator (B), wherein the polymerizable compound (A) comprises (A1) a polymerizable compound having at least one of a fluorine atom and a silicon atom and (A2) a polymerizable compound having an aromatic group.

<(A) Polymerizable Compound>

The polymerizable compound (A) comprises a polymerizable compound (A1) having at least one of a fluorine atom and a silicon atom and a polymerizable compound (A2) having an aromatic group. The polymerizable compound (A) may further contain any other polymerizable compound.

The polymerizable functional group that the polymerizable compound (A) has includes a radical polymerizable functional group such as a (meth)acrylate group, a (meth) acrylamide group, a vinyl group, an allyl group, etc.; a cationic polymerizable functional group such as an epoxy group, an oxetanyl group, a vinyl ether group, etc. Preferred is a radical polymerizable functional group, and more preferred is a (meth)acrylate group.

The polymerizable compound (A1) having at least one of a fluorine atom and a silicon atom and the polymerizable compound (A2) having an aromatic group are described below. ((A1) Polymerizable compound having at least one of fluorine atom and silicon atom)

The polymerizable compound (A1) having at least one of a fluorine atom and a silicon atom is a compound that has at least one functional group having a fluorine atom or a silicon atom or both of a fluorine atom and a silicon atom and has at least one polymerizable functional group.

The polymerizable compound (A1) having at least one of a fluorine atom and a silicon atom may be a low-molecular compound or a polymer.

In the case where the polymerizable compound (A1) having at least one of a fluorine atom and a silicon atom is a polymer, it may has a recurring unit having at least anyone of a fluorine atom or a silicon atom, and a recurring unit having a polymerizable group in the side chain thereof as a copolymerizable component. The recurring unit having at least any one of a fluorine atom or a silicon atom may have a polymerizable group in the side chain thereof, especially at the terminal thereof. In this case, the skeleton of the recurring unit having at least one of a fluorine atom or a silicon atom is not specifically defined so far as it is not contradictory to the scope and the spirit of the invention, but preferably has a skeleton derived from a group having an ethylenic unsaturated bond, and more preferred is an embodiment having a (meth)acrylate skeleton. The recurring unit having a silicon atom may be such that the silicon atom itself forms a recurring unit, for example, as in a dimethylsiloxane structure.

Not specifically defined, the content of (A1) in the curable composition for imprints of the invention is preferably from 0.1 to 100% by mass of all the polymerizable compounds, from the viewpoint of improving the curability of the composition and the viscosity thereof, more preferably from 0.2 to 50% by mass, even more preferably from 0.5 to 20% by mass, still more preferably from 1 to 10% by mass.

(1) Polymerizable Compound having a Fluorine Atom:

The group having a fluorine atom which may be in the polymerizable compound having a fluorine atom is preferably selected from a fluoroalkyl group and a fluoroalkyl ether group. More preferably, the polymerizable compound having a fluorine atom has at least one of a perfluoroalkyl group and a perfluoroalkylene group.

The fluoroalkyl group is preferably a fluoroalkyl group having at least 2 carbon atoms, more preferably a fluoroalkyl group having at least 4 carbon atoms. Not specifically defined, the uppermost limit of the number of the carbon atoms of the group is at most 20, more preferably at most 8, even more preferably at most 6; and most preferred is a fluoroalkyl group having from 4 to 6 carbon atoms. Preferred examples of the fluoroalkyl group include a trifluoromethyl group, a pentafluoroethyl group, a heptafluoropropyl group, a hexafluoroisopropyl group, a nonafluorobutyl group, a tridecafluorohexyl group, a heptadecafluorooctyl group.

Preferably, the polymerizable compound (A1) having at least one of a fluorine atom and a silicon atom is a polymerizable compound having a fluorine atom that has a trifluoromethyl group. Specifically, at least one of the fluoroalkyl group in the compound preferably has a trifluoromethyl group structure. Having a trifluoromethyl group structure, the compound may exhibit the effect of the invention even though its amount added to the composition is small (for example, at most 10% by mass), and therefore, the miscibility of the compound with the other ingredients is improved and the line edge roughness after dry etching the composition is thereby reduced, and furthermore the patternability in repeated patterning is improved.

Like the fluoroalkyl group, the fluoroalkyl ether is preferably one having a trifluoromethyl group, and is preferably one having a perfluoroethyleneoxy group or a perfluoropropyleneoxy group. Also preferred is one having a trifluoromethyl group at the terminal of a fluoroalkyl ether unit and/or a fluoroalkyl ether group having a trifluoromethyl group such as —(CF(CF$_3$)CFO)— or the like.

The number of all the fluorine atoms in the polymerizable compound (A1) having at least one of a fluorine atom and a silicon atom is preferably from 6 to 60, more preferably from 9 to 40, even more preferably from 12 to 40 in the molecule.

The polymerizable compound (A1) having at least one of a fluorine atom and a silicon atom preferably has a fluorine content, as defined below, of from 20 to 60%. In the case where the polymerizable compound (A1) is a polymer compound, the fluorine content thereof, as defined below, is preferably from 30 to 60%, more preferably from 35 to 60%. In the case where the polymerizable compound (A1) is a polymer having a polymerizable group, the fluorine content thereof, as defined below, is preferably from 20 to 50%, more preferably from 20 to 40%. Having the fluorine content that falls within the preferred range; its compatibility with the other ingredients is improved; molds are prevented from getting dirty; the line edge roughness after dry etching can be reduced and the effect of the invention that improves patternability in repeated patterning is enhanced. In this description, the fluorine content is defined by the following formula:

Fluorine Content=[(number of fluorine atoms in polymerizable compound)×(atomic weight of fluorine atom)/(molecular weight of polymerizable compound)]×100.

One preferred example of the polymerizable compound (A1) having at least one of a fluorine atom and a silicon atom is a compound having a partial structure of the formula (I) below. Use of a compound having the partial structure improves patternability even in repeated patterning and durable stability of the composition.

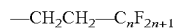  (I)

In formula (I), n indicates an integer of from 1 to 8, preferably an integer of from 4 to 6.

Another preferred example of the polymerizable compound (A1) having at least one of a fluorine atom and a silicon atom is a compound having a partial structure of the following formula (II). Needless-to-say, the compound may have both the partial structure of formula (I) and the partial structure of formula (II).

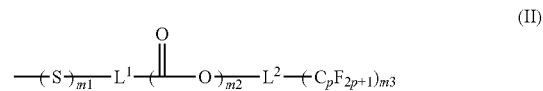

In formula (II), $L^1$ represents a single bond, or an alkylene group having from 1 to 8 carbon atoms; $L^2$ represents a linking group, preferably an alkylene group having from 1 to 8 carbon atoms; m1 and m2 each indicate 0 or 1, and at least one of m1 and m2 is 1; m3 indicates an integer of from 1 to 3; p indicates an integer of from 1 to 8; when m3 is 2 or more, (—C$_p$F$_{2p+1}$)'s may be the same or different.

$L^1$ and $L^2$ each are preferably an alkylene group having from 1 to 4 carbon atoms. Not overstepping the spirit and the scope of the invention, the alkylene group may have a substituent. m3 is preferably 1 or 2. p is preferably an integer of from 4 to 6.

The polymerizable compound (A1) having at least one of a fluorine atom and a silicon atom is preferably a fluorine atom-containing polymer having a weight-average molecular weight of from 2000 to 100000. More preferably, the weight-average molecular weight of the fluorine atom-containing polymer is from 3000 to 70000, even more preferably from 5000 to 40000. In this description, the weight-average molecular weight is measured through GPC in terms of standard polystyrene.

A polymerizable compound having two or more groups having fluorine atom (for example fluoroalkyl group and fluoroalkyl ether group) in the molecule can be particularly preferably used as the polymerizable compound (A) having at least one of a fluorine atom and a silicon atom. The polymerizable compound having two or more groups having a fluorine atom exhibits the effect of the invention even though its amount added to the composition is small. Additionally, mold filling capability is improved and the line edge roughness after dry etching the composition can be reduced. The number of the groups having a fluorine atom in the molecule is preferably from 2 to 4, more preferably 2 or 3, still more preferably 2.

The polymerizable compound having two or more fluoroalkyl groups or fluoroalkyl ether groups in the molecule is preferably a polymerizable monomer represented by the following formula (III):

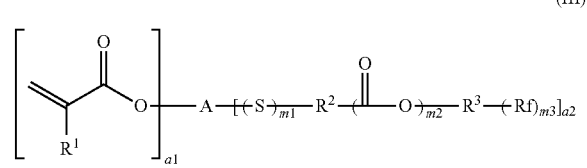

In formula (III), $R^1$ represents a hydrogen atom, an alkyl group, a halogen atom or a cyano group, preferably a hydrogen atom or an alkyl group, more preferably a hydrogen atom or a methyl group, still more preferably a hydrogen atom.

A represents an (a1+a2)-valent linking group, preferably a group having at least one of an alkylene group and an arylene group. A may contain a linking group having a hetero atom, which includes —O—, —C(=O)O—, —S— and —C(=C)—. These groups may have a substituent so far as it is not contradictory to the scope and the spirit of the invention, but no substituent is preferable. The carbon number of A is preferably from 2 to 5, more preferably from 4 to 15.

a1 indicates an integer of from 1 to 6, preferably an integer of from 1 to 3, more preferably 1 or 2.

a2 indicates an integer of from 2 to 6, preferably 2 or 3, more preferably 3.

$R^2$ represents a single bond or an alkylene group having from 1 to 8 carbon atoms.

$R^3$ represents a linking group, preferably a single bond or an alkylene group having from 1 to 8 carbon atoms.

Rf represents a fluoroalkyl group or a fluoroalkyl ether group, preferably a fluoroalkyl group having from 1 to 8 carbon atoms or a fluoroalkyl ether group having from 3 to 20 carbon atoms.

m1 and m2 each independently indicate 0 or 1. m3 indicates an integer of from 1 to 3. When a1 is 2 or more, each $R^1$ may be the same or different. When a2 is 2 or more, each $R^2$, $R^3$, m1, m2 and m3 may be the same or different. When m3 is 2 or more, each Rf may be the same or different.

In the case where a polymer is used as the polymerizable compound having a group having a fluorine atom in the curable composition for imprints of the invention, it is preferably a polymer containing a recurring unit derived from the preferable polymerizable compound having a group having a fluorine atom described above.

The polymerizable compound (A1) having at least one of a fluorine atom and a silicon atom may be a polymer having a fluorine atom with a weight-average molecular weight of from 1000 to 100000. More preferably, the weight-average molecular weight of the polymer having a fluorine atom is from 2000 to 100000, even more preferably from 5000 to 50000. In this description, the weight-average molecular weight is measured through GPC in terms of standard polystyrene.

Specific examples of the polymerizable compound having a fluorine atom for use in the curable composition for imprints of the invention are described below, to which, however, the invention should not be limited.

The polymerizable compound having a fluorine atom includes monofunctional polymerizable compounds having a fluorine atom such as trifluoroethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth)acrylate, tetrafluoropropyl (meth)acrylate, hexafluoropropyl (meth)acrylate, etc. As the polymerizable compound having a fluorine atom, also preferred are polyfunctional polymerizable compounds having two or more polymerizable functional groups and having a fluoroalkylene group and a di(meth)acrylate moiety, such as 2,2,3,3,4,4,-hexafluoropentane di(meth)acrylate, 2,2,3,3,4,4,5,5-octafluorohexane di(meth)acrylate, etc.

Preferable examples of the polymerizable compound having two or more fluoroalkyl groups or fluoroalkyl ether groups in the molecule includes the compounds having the following structures. In the structures, $R^1$ represents a hydrogen atom, an alkyl group, a halogen atom or a cyano group.

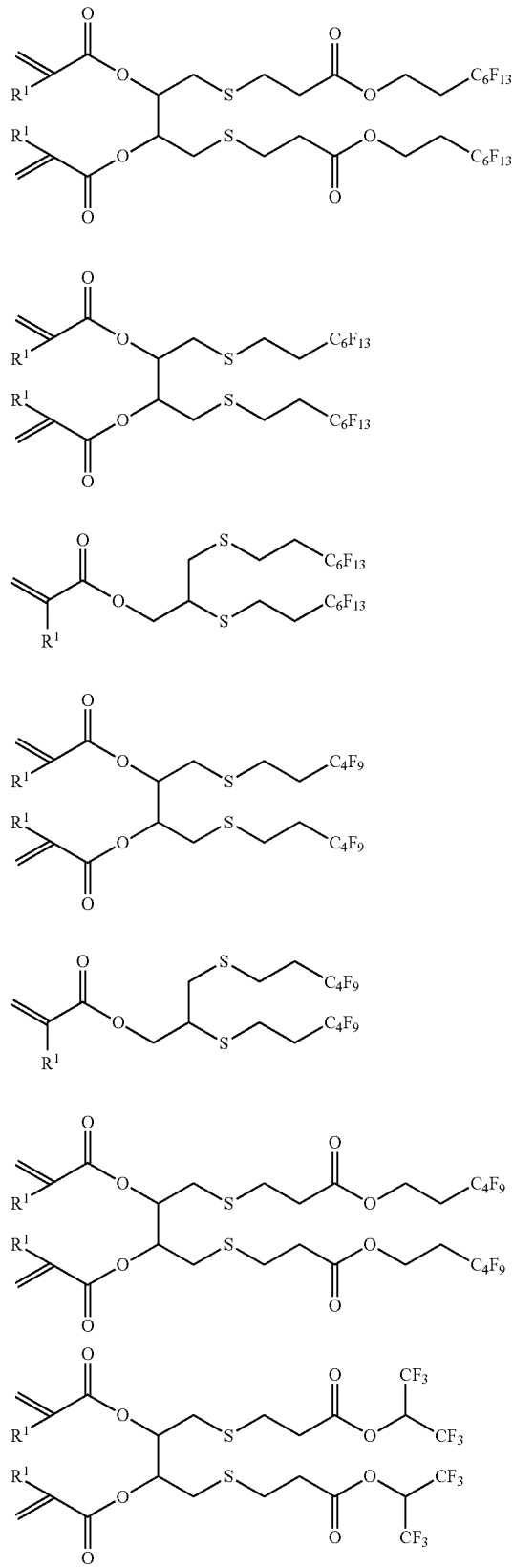

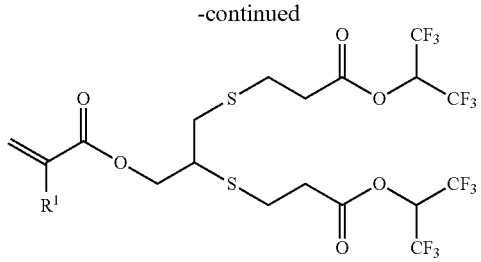
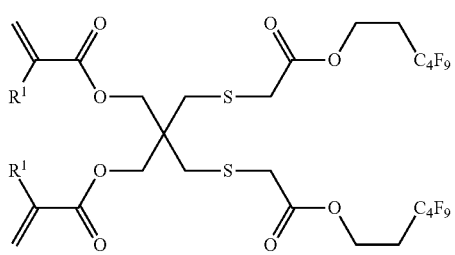
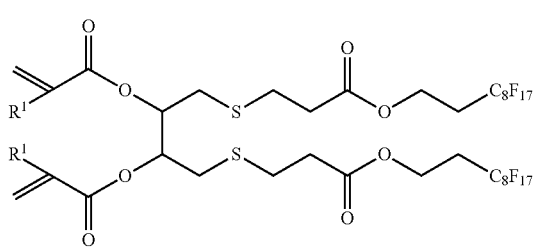
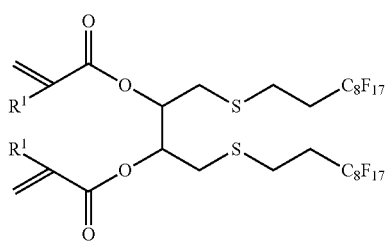
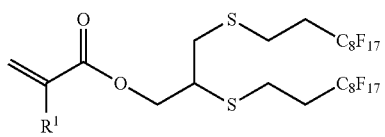
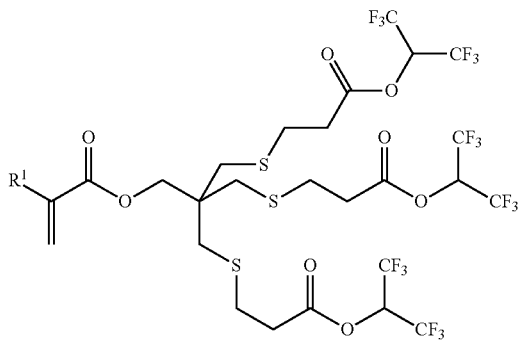
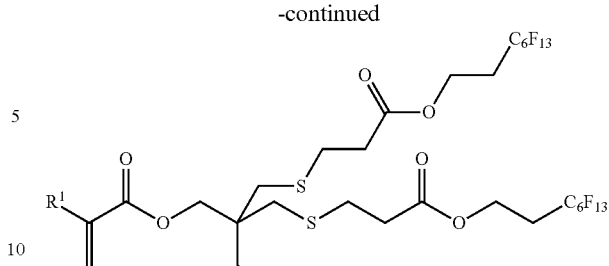
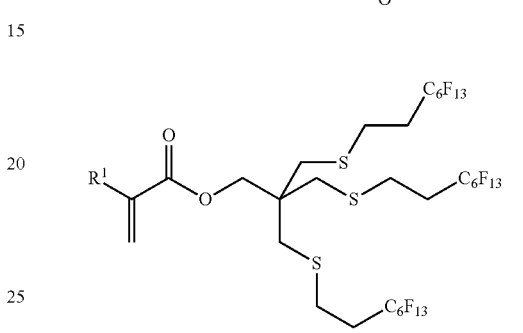
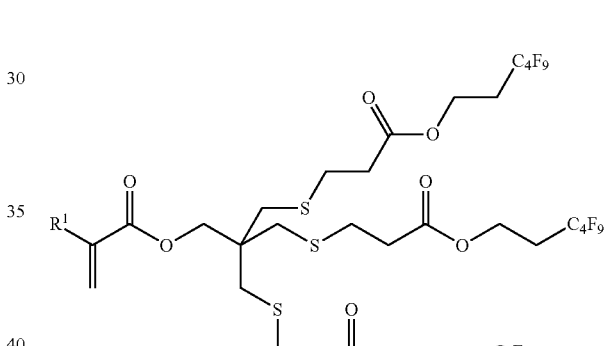
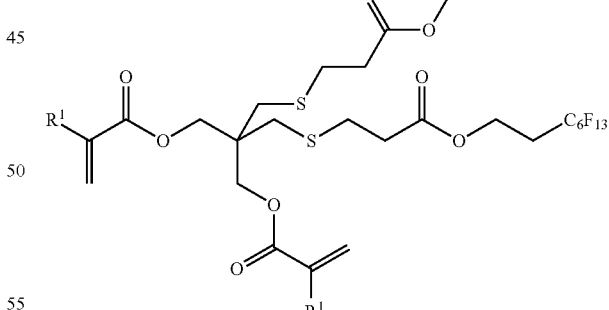
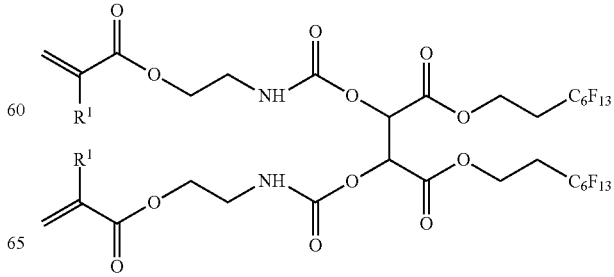

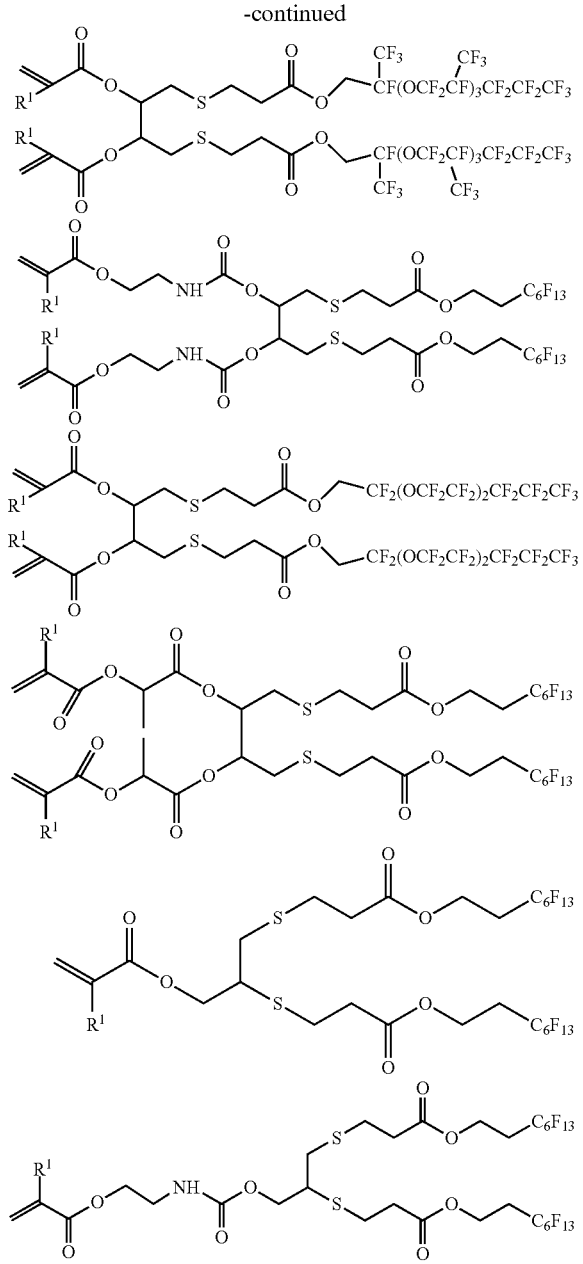

(2) Polymerizable Compound having a Silicon Atom:

The functional group having a silicon atom which may be in the polymerizable compound having a silicon atom includes a trialkylsilyl group, a linear siloxane structure, a cyclic siloxane structure, a caged siloxane structure, etc. Preferred is a functional group having a trimethylsilyl group or a dimethylsiloxane structure, from the viewpoint of the miscibility of the compound with other ingredients and the mold releasability of the composition.

The polymerizable compound (A1) having at least one of a fluorine atom and a silicon atom is preferably non-reactive and particularly preferably free from a silane-coupling group.

The polymerizable compound (A1) having at least one of a fluorine atom is preferably a monomer having a silicon atom in the viewpoint of compatibility to the other components.

Specific examples of the polymerizable compound having a silicon atom for use in the curable composition for imprints of the invention are shown below, to which, however, the invention should not be limited.

The polymerizable compound having a silicon atom includes 3-tris(trimethylsilyloxy)silylpropyl (meth)acrylate, trimethylsilylethyl (meth)acrylate, polydimethylsiloxane-substituted alkyl (meth)acrylate, polydimethylsiloxane structure-containing di(meth)acrylate.

((A2) Polymerizable Compound having an Aromatic Group)

The polymerizable functional group which may be in the polymerizable compound (A2) having an aromatic group includes a radical polymerizable functional group such as a (meth)acylate group, a (meth)acrylamide group, a vinyl group and an allyl group; and a cationic polymerizable functional group such as an epoxy group, an oxetanyl group and a vinylether group. Preferred is an radical polymerizable functional group and more preferred is a (meth)acrylate group. The number of polymerizable group is preferably from 1 to 3, more preferably 1 or 2.

The polymerizable compound (A2) having an aromatic group preferably has a molecular weight of from 150 to 500, more preferably from 200 to 350, still more preferably from 200 to 300. By controlling the molecular weight within an appropriate range, the viscosity and the volatility of the composition can be lower and thereby the composition can be prevented from being changed in its composition when it is applied on a substrate.

The polymerizable compound (A2) having an aromatic group preferably has a viscosity of from 2 to 300 mPa·s, more preferably from 3 to 200 mPa·s, even more preferably from 5 to 100 mPa·s, most preferably from 5 to 50 mPa·s.

The aromatic group which may be in the polymerizable compound (A2) having an aromatic group includes an aromatic hydrocarbon group such as a phenyl group, a naphthyl group and a anthracenyl group; and a hetero aromatic group having a hetero atom such as a nitrogen atom, a sulfur atom and an oxygen atom in the ring. Preferred is an aromatic hydrocarbon group and more preferred are a phenyl group and a naphthyl group. The aromatic group may be substituted at the terminal of the molecule or may be introduced as a linking group. The aromatic group may be substituted. Preferable substituents include an alkyl group, an alkoxy group, an aryloxy group, an aryl group, a cyano group, an acyl group, an acyloxy group, an aralkyl group and an alkoxycarbonyl group.

The content of the polymerizable compound (A2) having an aromatic group in the curable composition for imprints of the invention is not specifically limited. In the viewpoint of curability and the viscosity of the composition, the content of the polymerizable compound (A2) in all the polymerizable compounds is preferably 80% by mass or more, more preferably 85% by mass or more, still more preferably 90% by mass or more. The upper limit of the content of the polymerizable compound (A2) is preferably 99.9% by mass, more preferably 99.5% by mass.

Followings are preferable examples of the polymerizable compound (A2) having an aromatic group which can be used in the curable composition for imprints of the invention. The present invention is not limited thereto.

More preferable examples of the polymerizable compound (A2) having an aromatic group include benzyl (meth)acylate, 1- or 2-naphthyl (meth)acrylate, 1- or 2-naphthylmethyl (meth)acrylate, 1- or 2-naphthylethyl (meth)acrylate and m-xylylene diacrylate. These compounds may have no substituent or a substituent on the aromatic ring. More preferred are benzyl (meth)acylate, 1- or 2-naphthylmethyl (meth)acrylate and m-xylylene diacrylate which may have no substituent or a substituent on the aromatic ring.

The polymerizable compound (A2) having an aromatic group used in the invention is preferably a polymerizable monomer represented by the following formulae (IV) to (XI):

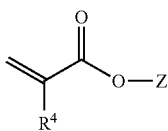

(IV)

In formula (IX), Z represents a group having an aromatic group, and $R^4$ represents a hydrogen atom, an alkyl group or a halogen atom with the proviso that the polymerizable monomer is liquid at 25° C., its viscosity at 25° C. is 500 mPa·s or less. The compound represented by the formula (IV) is a monofunctional (meth)acrylate compound having one (meth)acrylate group in the molecule.

$R^4$ is preferably a hydrogen atom or an alkyl group, more preferably a hydrogen atom or a methyl group, still more preferably a hydrogen atom from the viewpoint of curability. Examples of the halogen atom include a fluorine atom, a chlorine atom, a bromine atom and an iodine atom. Preferred is a fluorine atom.

Z is preferably an aralkyl group which may have a substituent, an aryl group which may have a substituent, or a group in which these groups are connected through a linking group. The linking group here include a linking group having a halogen atom, and is preferably —CH$_2$—, —O—, —C(=O)—, —S— and a combination thereof. The aromatic group contained in Z is preferably a phenyl group or a naphthyl group. More preferably, Z has a phenyl group only as the aromatic group. In the case where Z is a phenyl group only, the viscosity is lower and patternability is better and particle defects can be prohibited compared to the compound in which Z is a polycyclic aromatic group or a heteroaromatic group. The molecular weight of Z is preferably from 100 to 300, more preferably from 120 to 250.

Z is preferably represented by $Z^1$-$Z^2$. $Z^1$ represents a single bond or a hydrocarbon group. The hydrocarbon group may have a linking group having a hetero atom in the chain thereof. $Z^2$ represents an aromatic group which may have a substituent and preferably have a molecular weight of 90 or more.

$Z^1$ is preferably a single bond or an alkylene group. The alkylene group may have a linking group having a hetero atom in the chain thereof. $Z^1$ is more preferably an alkylene group not having a linking group having a hetero atom in the chain thereof, still more preferably a methylene group or an ethylene group. Examples of the linking group having a hetero atom include —O—, —C(=O)—, —S— and a group having at least one of these groups and an alkylene group in combination. The hydrocarbon group preferably has from 1 to 3 carbon atoms.

$Z^2$ is preferably an aromatic group having a substituent with a molecular weight of 15 or more. Examples of the aromatic group in $Z^2$ include a phenyl group and a naphthyl group. More preferred is a phenyl group having a substituent with a molecular weight of 15 or more.

$Z^2$ is preferably a group in which two or more aromatic groups are connected directly or through a linking group.

Examples of preferable linking group here include —CH$_2$—, —O—, —C(=O)—, —S— and a combination thereof.

Examples of the substituent on the aromatic group in the polymerizable monomer represented by the formula (IV) include a halogen atom (for example, a fluorine atom, a chlorine atom, a bromine atom), a linear, branched or cyclic alkyl group, a linear, branched or cyclic alkenyl group, a linear, branched or cyclic alkynyl group, an aryl group, an acyl group, an alkoxycarbonyl group, aryloxycarbonyl group, a carbamoyl group, a cyano group, a carboxyl group, a hydroxyl group, an alkoxy group, an aryloxy group, an alkylthio group, an arylthio group, a heterocyclic oxy group, an acyloxy group, an amino group, a nitro group, a hydrazino group and a heterocyclic group. Also preferred are these groups substituted with these groups.

Preferred examples of the polymerizable monomer having no substituent on the aromatic group include benzyl (meth)acrylate, phenetyl (meth)acrylate, phenoxyethyl (meth)acrylate, 1- or 2-naphthyl (meth)acrylate, 1- or 2-naphthylmethyl (meth)acrylate, 1- or 2-naphthylethyl (meth)acrylate, and 1- or 2-naphthyloxyethyl (meth)acrylate.

The polymerizable monomer represented by the formula (IV) is preferably liquid at 25° C. or solid with a melting point of 60° C. or lower, more preferably liquid at 25° C.

The amount of the polymerizable monomer represented by the formula (IV) in the curable composition for imprints of the invention is preferably from 10 to 100% by mass, more preferably from 20 to 100% by mass, particularly preferably from 30 to 80% by mass, relative to all the polymerizable monomers contained in the composition.

The compound represented by the formula (IV) is preferably a compound represented by the following formula (V):

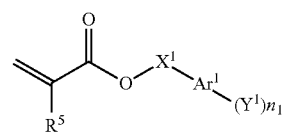

(V)

In formula (V), $R^5$ represents a hydrogen atom, an alkyl group or a halogen atom, $X^1$ represents a single bond or a hydrocarbon group, the hydrocarbon group may have a linking group having a hetero atom in the chain thereof, $Y^1$ represents a substituent with a molecular weight of 15 or more, n1 is an integer of from 0 to 3 with the proviso that when n1 is 0, then $X^1$ is a hydrocarbon group having two or more carbon atoms. $Ar^1$ represents an aromatic group or an aromatic linking group and is preferably a phenyl group or a phenylene group.

$R^5$ has the same definition and the same preferred range as $R^4$ in the above formula (IV).

$X^1$ has the same definition and the same preferred range as $Z^1$ in the above formula (IV).

$Y^1$ is a substituent with a molecular weight of 15 or more, which include an alkyl group, an alkoxy group, an aryloxy group, an aralkyl group, an acyl group, an alkoxycarbonyl group, an alkylthio group, an aryltio group and a halogen atom. These substituents may further have a substituent.

When n1 is 0, then $X^1$ is preferably an alkylene group having 2 or 3 carbon atoms. When n1 is 2, then $X^1$ is preferably a single bond or a hydrocarbon group having one carbon atom.

Particularly preferred is n1 is 1 and $X^1$ is an alkylene group having from 1 to 3 carbon atoms.

The compound represented by the formula (V) is preferably a compound represented by the following formula (VI):

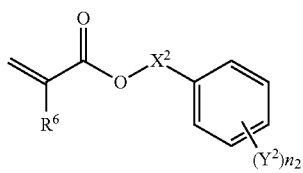

(VI)

In formula (VI), $R^6$ represents a hydrogen atom, an alkyl group or a halogen atom, $X^2$ represents a single bond or a hydrocarbon group, the hydrocarbon group may have a linking group having a hetero atom in the chain thereof, $Y^2$ represents a substituent with a molecular weight of 15 or more, n2 is an integer of from 0 to 3 with the proviso that when n2 is 0, then $X^2$ is a hydrocarbon group having two or more carbon atoms.

$R^6$ has the same definition and the same preferred range as $R^4$ in the above formula (IV).

$X^2$ has the same definition and the same preferred range as $Z^1$ in the above formula (IV).

$Y^2$ has the same definition and the same preferred range as $Y^1$ in the above formula (V).

n2 has the same definition and the same preferred range as n1 in the above formula (V).

The compound represented by the formula (VI) is preferably a compound represented by one of the following formulae (VII) to (X):

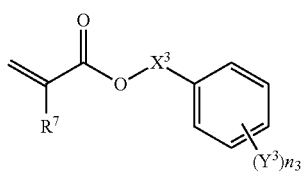

(VII)

In formula (VII), $R^7$ represents a hydrogen atom, an alkyl group or a halogen atom, $X^3$ represents a single bond or a hydrocarbon group, the hydrocarbon group may have a linking group having a hetero atom in the chain thereof, $Y^3$ represents a substituent free from an aromatic group with a molecular weight of 15 or more, n3 is an integer of from 0 to 3 with the proviso that when n3 is 0, then $X^3$ is a hydrocarbon group having 2 or 3 carbon atoms.

$R^7$ has the same definition and the same preferred range as $R^4$ in the above formula (IV).

When $X^3$ is a hydrocarbon group, it is preferably a hydrocarbon group having from 1 to 3 carbon atoms, more preferably a substituted or unsubstituted alkylene group having from 1 to 3 carbon atoms, still more preferably an unsubstituted alkylene group having from 1 to 3 carbon atoms, still further more preferably an ethylene group. In the case where $X^3$ is such hydrocarbon group, a curable composition for imprints having a lower viscosity and less volatile can be provided.

$Y^3$ is a substituent having no aromatic group with a molecular weight of 15 or more. The upper limit of the molecular weight is preferably 80. Examples of preferred $Y^3$ include an alkyl group having from 1 to 6 carbon atoms such as a methyl group, an ethyl group, an isopropyl group, a tert-butyl group and a cyclohexyl group; a halogen atom such as a chlorine atom and a bromine atom; and alkoxy group such as a methoxy group, an ethoxy group and a cyclohexyloxy group.

n3 is preferably an integer of from 0 to 2. When n3 is 1, then $Y^3$ is at the para position. When n3 is 2, then $X^3$ is preferably a single bond or a hydrocarbon group having one carbon atom from the viewpoint of viscosity.

The compound represented by the formula (VII) is preferably a monofunctional (meth)acylate having one (meth)acylate group.

The molecular weight of the (meth)acrylate compound represented by the formula (VII) is preferably from 175 to 250, more preferably from 185 to 245 from the viewpoint of both low viscosity and low volatility.

The viscosity at 25° C. of the (meth)acrylate compound represented by the formula (VII) is preferably 10 mPa·s or less, more preferably 6 mPa·s or less.

The compound represented by the formula (VII) can also be used as a diluent for reaction preferably.

The amount of the compound represented by the formula (VII) in the curable composition for imprints of the invention is preferably 10% by mass or more, more preferably 15% by mass or more, particularly preferably 20% by mass or more, relative to all the polymerizable compounds in the composition from the view point of viscosity of the composition and patternability after the cure. The amount is preferably 95% by mass or less, more preferably 90% by mass or less, particularly preferably 85% by mass or less from the viewpoint of tackiness after the cure and mechanical strength.

Followings are examples of the compounds represented by the formula (VII) but the compounds which can be used in the invention are not limited thereto.

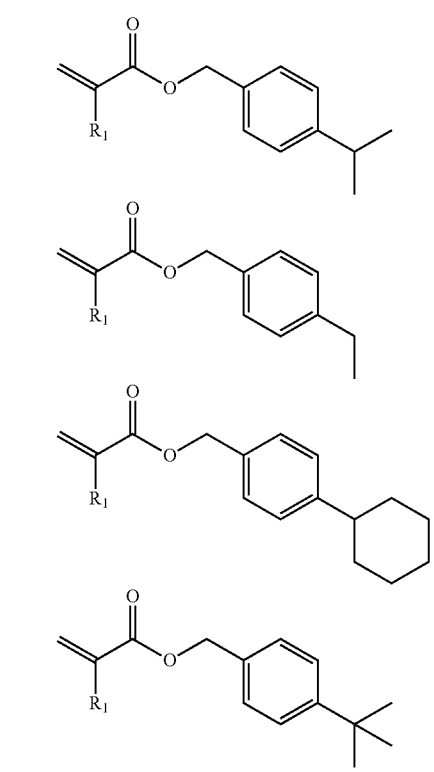

-continued

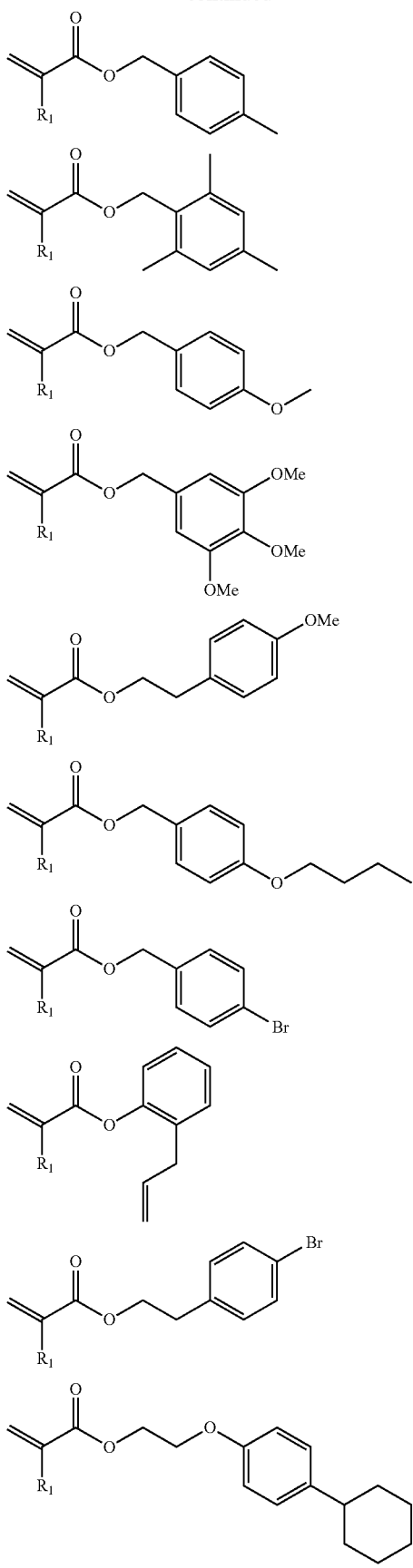

-continued

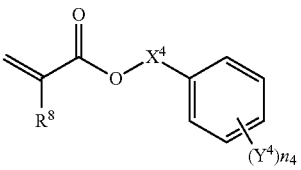

(VIII)

In formula (VIII), $R^8$ represents a hydrogen atom, an alkyl group or a halogen atom, $X^4$ represents a single bond or a hydrocarbon group, the hydrocarbon group may have a linking group having a hetero atom in the chain thereof, $Y^4$ represents a substituent having an aromatic group, n4 is an integer of from 1 to 3.

$R^8$ has the same definition and the same preferred range as $R^4$ in the above formula (IV).

$X^4$ has the same definition and the same preferred range as $Z^1$ in the above formula (IV).

$Y^4$ is a substituent having an aromatic group, in which the aromatic group is preferably bonded to the aromatic ring in the formula (VIII) through a single bond or a linking group. The linking group here may be preferably an alkylene group, a linking group having a hetero atom (preferably —O—, —S—, —C(=O)O—) or a combination thereof, more preferably an alkylene group, —O— or a combination thereof. The substituent having an aromatic group is preferably a substituent having a phenyl group, more preferably a substituent in which a phenyl group is bonded through a single bond or one of the above linking groups, particularly preferably a phenyl group, a benzyl group, a phenoxy group, a benzyloxy group or a phenylthio group. The total molecular weight of all $Y^4$ is 350 or less.

n4 is preferably 1 or 2, more preferably 1.

The amount of the compound represented by the formula (VIII) in the curable composition for imprints of the invention is preferably 10% by mass or more, more preferably 15% by mass or more, particularly preferably 20% by mass or more, relative to all the polymerizable compounds in the composition. The amount is preferably 90% by mass or less, more preferably 80% by mass or less, particularly preferably 70% by mass or less from the viewpoint of tackiness after the cure and mechanical strength.

Followings are examples of the compounds represented by the formula (VIII) but the compounds which can be used in the invention are not limited thereto.

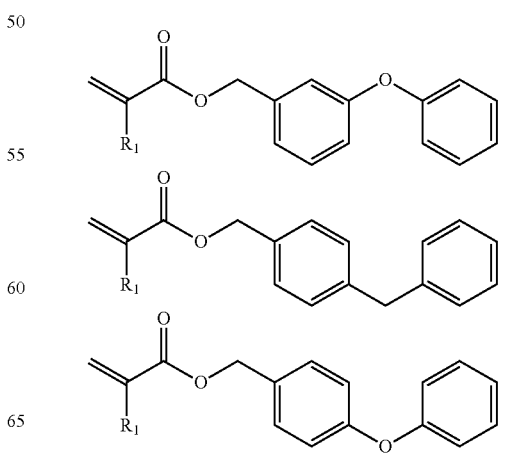

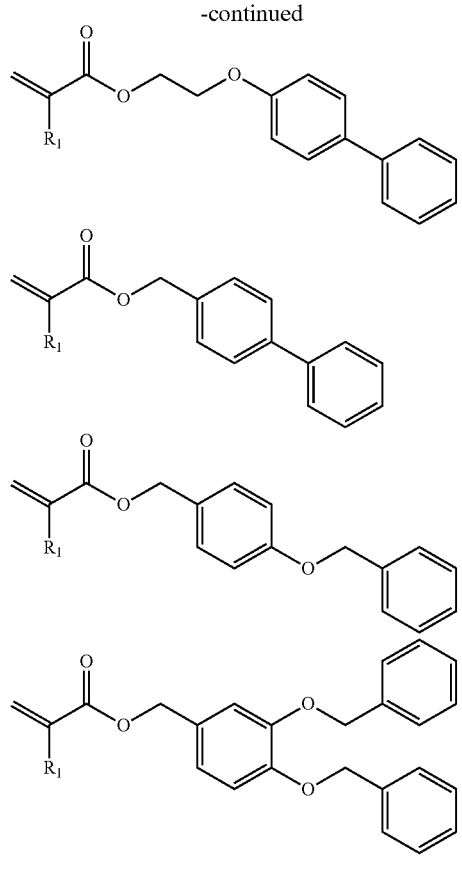

(IX)

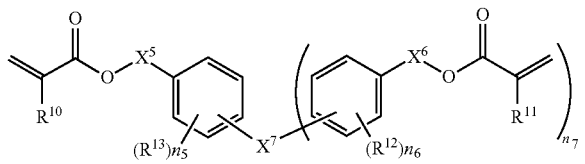

In formula (IX), $R^7$ represents an (n7+1)-valent linking group, $R^{10}$ and $R^{11}$ each independently represent a hydrogen atom, an alkyl group or a halogen atom, $R^{12}$ and $R^{13}$ each independently represent a substituent, n5 and n6 each independently are an integer of from 0 to 4, n7 is 1 or 2, $X^5$ and $X^6$ each independently represent a hydrocarbon group which may have a linking group having a hetero atom in the chain thereof.

$R^7$ is an (n7+1)-valent linking group, preferably di- or tri-valent saturated hydrocarbon group (for example an alkylene group), —O—, —S—, —C(=O)O— or a linking group in which two or more of these linking groups are combined. The number of carbon atoms in the di- or tri-valent saturated hydrocarbon group is preferably from 1 to 8, more preferably from 1 to 3. It is preferably unsubstituted.

n7 is preferably 1. When n7 is 2, then the two $R^{11}$, the two $X^6$ and the two $R^{12}$ may be the same or different, respectively.

$X^5$ and $X^6$ each are preferably an alkylene group having no other linking group, more preferably an alkylene having from 1 to 5 carbon atoms, still more preferably an alkylene having from 1 to 3 carbon atoms, most preferably an methylene group.

$R^{10}$ and $R^{11}$ each have the same definition and the same preferred range as $R^4$ in the above formula (IV).

$R^{12}$ and $R^{13}$ each are a substituent, preferably an alkyl group, a halogen atom, an alkoxy group, an acyl group, an acyloxy group, an alkoxycarbonyl group, a cyano group and a nitro group. The alkyl group preferably has from 1 to 8 carbon atoms. Examples of the halogen atom include a fluorine atom, a chlorine atom, a bromine atom and an iodine atom and a fluorine atom is preferable. The alkoxy group preferably has from 1 to 8 carbon atoms. The acyl group preferably has from 2 to 8 carbon atoms. The acyloxy group preferably has from 2 to 8 carbon atoms. The alkoxycarbonyl group preferably has from 2 to 8 carbon atoms.

n5 and n6 each are an integer of from 0 to 4. When n5 or n6 is 2 or more, then the two or more $R^{12}$ and the two or more $R^{13}$ may be the same or different, respectively.

The compound represented by the formula (IX) is preferably a compound represented by the following formula (X):

(X)

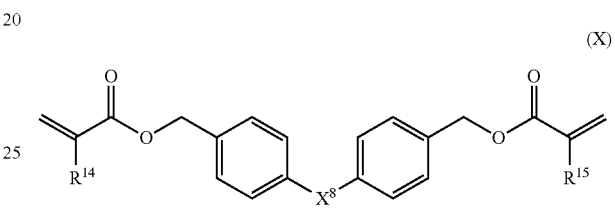

In formula (X), $X^8$ represents an alkylene group, —O—, —S— or a linking group in which two or more of these linking groups are connected. $R^{13}$ and $R^{14}$ each independently represent a hydrogen atom, an alkyl group or a halogen atom.

$R^{13}$ and $R^{14}$ each have the same definition and the same preferred range as $R^4$ in the above formula (IV).

When $X^8$ is an alkylene group, it is preferably an alkylene group having from 1 to 8 carbon atoms, more preferably an alkylene group having from 1 to 3 carbon atoms. Preferred is an unsubstituted alkylene group.

$X^8$ is preferably —CH$_2$—, —CH$_2$CH$_2$—, —O— or —S—.

The amount of the compound represented by the formula (IX) in the curable composition for imprints of the invention is not specifically limited, but is preferably from 1 to 100% by mass, more preferably from 5 to 70% by mass, particularly preferably from 10 to 50% by mass, relative to all the polymerizable monomers in the curable composition for imprints from the viewpoint of viscosity of the composition.

Examples of the compounds represented by the formula (IX) include an ethyleneoxy-modified bisphenol-A (meta) acrylate, propyleneoxy-modified bisphenol-A (meta)acrylate, and the compounds exemplified below. The compounds which can be used in the invention are not limited to these compounds. In the following formulae, each R has the same definition and the same preferred range as $R^{10}$ and $R^{11}$ in the above formula (IX). Particularly preferably R is a hydrogen atom.

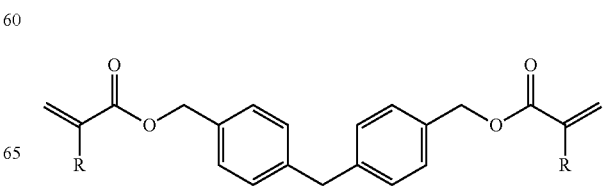

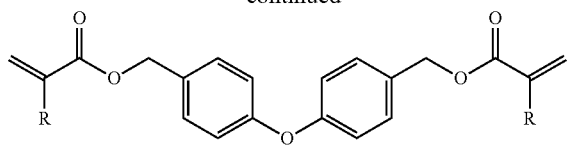
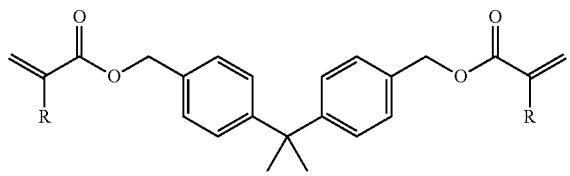
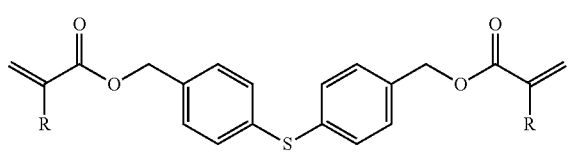
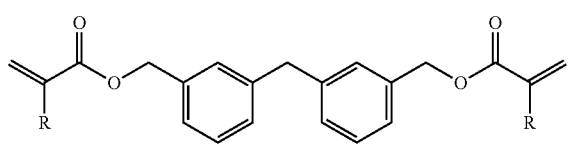
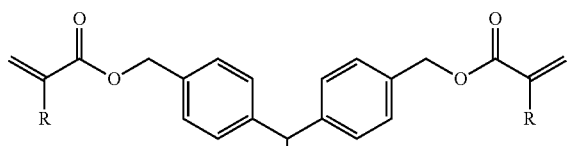
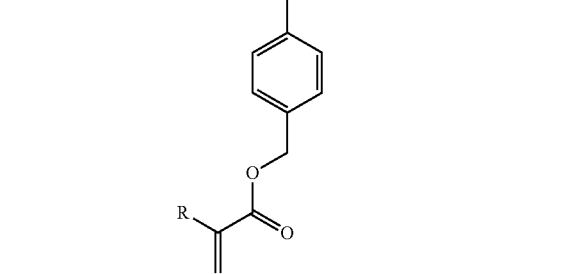
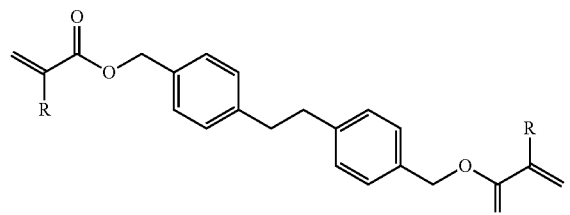
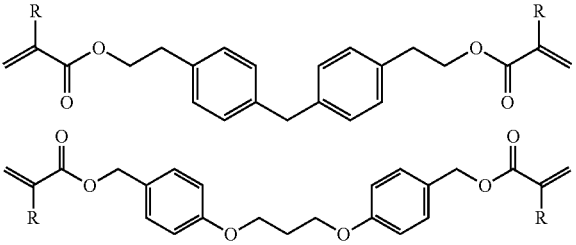

The polymerizable monomer represented by the following formula (XI) is also preferably used.

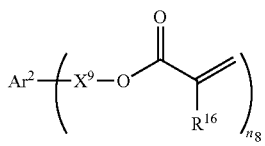
(XI)

In formula (XI), $Ar^2$ represents an aromatic linking group which may have a substituent, $X^9$ represents a single bond or an organic linking group, $R^{16}$ represents a hydrogen atom or a methyl group, and n8 is 2 or 3.

The aromatic linking group includes a linking group having a hydrocarbon aromatic ring and a linking group having a hetero ring. Examples of divalent aromatic linking group include a hydrocarbon arylene group such as a phenylene group and a naphthylene group; and a heteroarylene group having indole, carbazole or others. Preferred is a hydrocarbon arylene group and more preferred is a phenylene group from the viewpoint of viscosity and etching resistance. The arylene group may have a substituent. Examples of preferable substituent include an alkyl group, an alkoxy group, a hydroxyl group, a cyano group, an alkoxycarbonyl group, an amide group and a sulfonamide group.

The organic linking group for $X^9$ is, for example, an alkylene group, an arylene group or an aralkylene group which may have a hetero atom in the chain thereof, preferably an alkylene group or an oxyalkylene group, more preferably an alkylene group. $X^9$ is particularly preferably a single bond or an alkylene group.

$R^{16}$ is a hydrogen atom or a methyl group, preferably a hydrogen atom.

n8 is 2 or 3, preferably 2.

The polymerizable monomer represented by the formula (XI) is preferably a polymerizable monomer represented by the following formula (XII) or (XIII) from the viewpoint of reducing the viscosity of the composition.

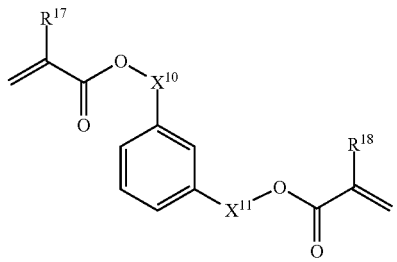
(XII)

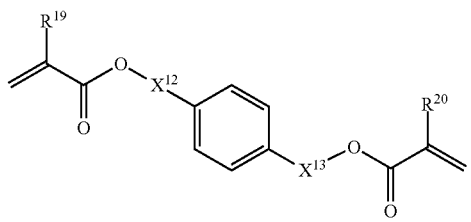
(XIII)

In the formulae (XII) and (XIII), $X^{10}$, $X^{11}$, $X^{12}$ and $X^{13}$ each independently represent a single bond or an alkylene group which may have a substituent having from 1 to 3 carbon atoms, and $R^{17}$, $R^{18}$, $R^{19}$ and $R^{20}$ each independently represent a hydrogen atom or a methyl group.

In the formulae (XII) and (XIII), $X^{10}$, $X^{11}$, $X^{12}$ and $X^{13}$ are preferably a single bond or a methylene group, more preferably a methylene group from the viewpoint of reducing the viscosity of the composition.

Preferred range of $X^{10}$, $X^{11}$, $X^{12}$ and $X^{13}$ is the same as the preferred range of $Z^1$ in the above formula (IV).

Preferred range of $R^{17}$, $R^{18}$, $R^{19}$ and $R^{20}$ is the same as the preferred range of $R^4$ in the above formula (IV).

The polymerizable monomer is preferably liquid because generation of impurities can be prohibited even when the added amount of the monomer increases.

Followings are examples of the polymerizable monomer represented by the formula (XI). R has the same definition of $R^{16}$ in the formula (XI), and is a hydrogen atom or a methyl group. The compounds which can be used in the invention are not limited to the following examples.

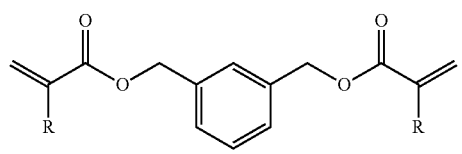

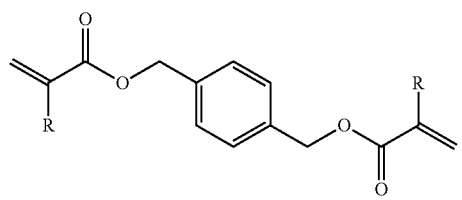

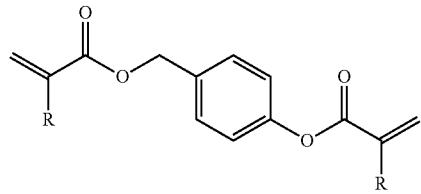

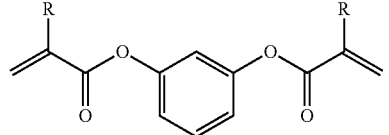

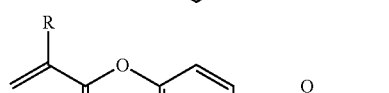

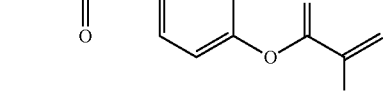

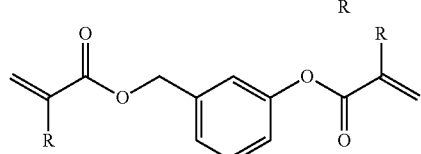

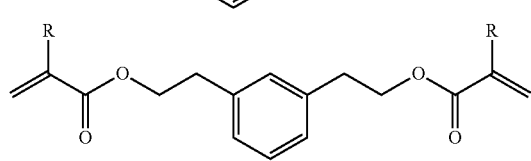

-continued

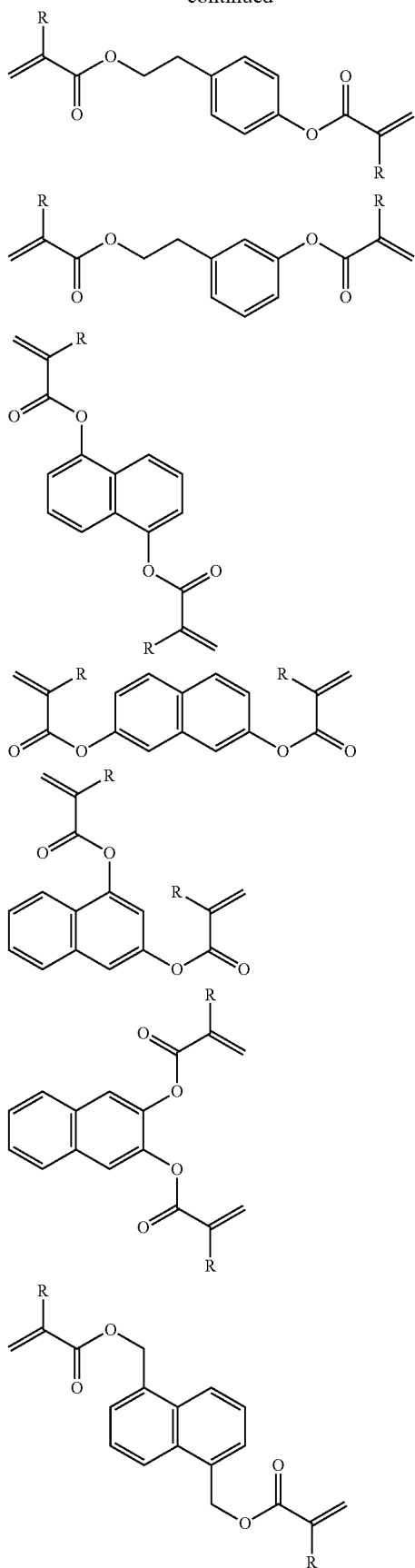

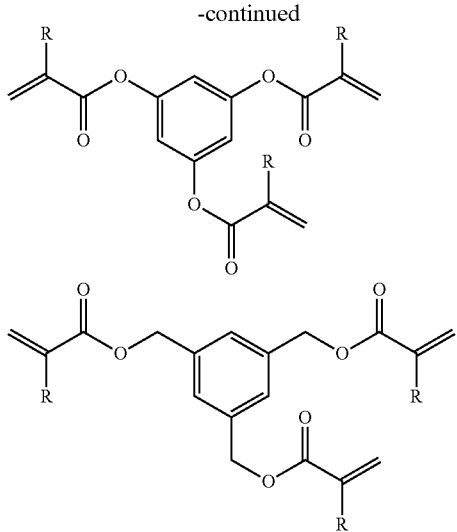

Followings are more preferred examples of the polymerizable compound (A2) having an aromatic group which is used in the curable composition for imprints of the invention. The compounds which can be used in the invention are not limited thereto.

Examples of the polymerizable compound having an aromatic group include a benzyl (meth)acrylate which is unsubstituted or substituted on the aromatic ring, phenetyl (meth)acrylate which is unsubstituted or substituted on the aromatic ring, phenoxyethyl (meth)acrylate which is unsubstituted or substituted on the aromatic ring, 1- or 2-naphthyl (meth)acrylate which is unsubstituted or substituted on the aromatic ring, 1- or 2-naphthylmethyl (meth)acrylate which is unsubstituted or substituted on the aromatic ring, 1- or 2-naphtylethyl (meth)acrylate which is unsubstituted or substituted on the aromatic ring, 1- or 2-naphtoxyethyl (meth)acrylate which is unsubstituted or substituted on the aromatic ring, resorcinol di(meth)acrylate which is unsubstituted or substituted on the aromatic ring, m-xylylene di(meth)acrylate which is unsubstituted or substituted on the aromatic ring, naphthalene di(meth)acrylate which is unsubstituted or substituted on the aromatic ring, and ethoxybisphenol-A diacrylate which is unsubstituted or substituted on the aromatic ring. More preferred are benzylacrylate which is unsubstituted or substituted on the aromatic ring, 1- or 2-naphthylmethyl acrylate which is unsubstituted or substituted on the aromatic ring, and m-xylylene acrylate which is unsubstituted or substituted on the aromatic ring.

The curable composition for imprints of the invention preferably comprises both a compound having one (meth)acylate group (preferably a compound represented by any one of the formulae (IV) to (VII)) and a compound having two or more (meth)acrylate groups (preferably a compound represented by the formula (VIII) or (IX)) as the polymerizable compound (A2) having an aromatic group.

—Other Polymerizable Compound—

The curable composition for imprints of the invention preferably contains the polymerizable compound (A) and other polymerizable compound in combination, if necessary, from the viewpoint of improvement of the viscosity of the composition, dry etching resistance, applicability to imprints and curability.

Said other polymerizable compound is preferably a polymerizable monomer. Examples of said other polymerizable compound include a polymerizable unsaturated monomer with 1 to 6 groups having an ethylenic unsaturated bond, a compound having an oxirane ring (an epoxy compound), a vinyl ether compound, a styrene derivative, a compound having a fluorine atom, propenyl ether and butenyl ether. Preferred is a polymerizable unsaturated monomer with 1 to 6 groups having an ethylenic unsaturated bond from the viewpoint of curability of the composition.

The polymerizable unsaturated monomer with 1 to 6 groups having an ethylenic unsaturated bond (mono- to hexa-functional polymerizable unsaturated monomer) is described below.

The polymerizable unsaturated monomer having one ethylenic unsaturated bond-containing group (mono-functional polymerizable unsaturated monomer) includes concretely 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl (meth)acrylate, 2-hydroxypropyl (meth)acrylate, 2-methoxyethyl (meth)acrylate, 3-methoxybutyl (meth)acrylate, 4-hydroxybutyl (meth)acrylate, acrylic acid dimer, butanediol mono(meth)acrylate, butoxyethyl (meth)acrylate, butyl (meth)acrylate, cetyl (meth)acrylate, ethyleneoxide-modified (hereinafter this may be referred to as "EO") dipropylene glycol (meth)acrylate, ethyl (meth)acrylate, isoamyl (meth)acrylate, isobutyl (meth)acrylate, isooctyl (meth)acrylate, cyclohexyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydiproylene glycol (meth)acrylate, methoxytripropylene glycol (meth)acrylate, methoxypolyethylene glycol (meth)acrylate, methoxytriethylene glycol (meth)acrylate, methyl (meth)acrylate, octyl (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tert-butyl (meth)acrylate, tribromophenyl (meth)acrylate, and tridodecyl (meth)acrylate.

Of those, in view of dry etching resistance, especially preferred are monofunctional (meth)acrylates having an acyclic hydrocarbon group. Examples of the monofunctional (meth)acrylates include dicyclopentanyl (meth)acrylate, dicyclopentanyloxyethyl (meth)acrylate, isobornyl (meth)acrylate, and adamantyl (meth)acrylate.

As the other polymerizable monomer, also preferred is a polyfunctional polymerizable unsaturated monomer having two ethylenic unsaturated bond-containing groups.

Preferred examples of the difunctional polymerizable unsaturated monomer having two ethylenic unsaturated bond-containing groups for use in the invention include diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene-urea, divinylpropylene-urea.

Of those, especially preferred for use in the invention are neopentyl glycol di(meth)acrylate, 1,9-nonanediol di(meth) acrylate, tripropylene glycol di(meth)acrylate, tetraethylene glycol di(meth)acrylate, hydroxypivalate neopentyl glycol di(meth)acrylate, polyethylene glycol di(meth)acrylate, etc.

Examples of the polyfunctional polymerizable unsaturated monomer having at least three ethylenic unsaturated bond-containing groups include ECH-modified glycerol tri(meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, etc.

Of those, especially preferred for use in the invention are EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, pentaerythritol ethoxy-tetra(meth)acrylate, pentaerythritol tetra(meth)acrylate, etc.

Among the above (meth)acrylate compounds, acrylate compounds are preferable from the viewpoint of curability.

The compound having an oxirane ring (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these may be used either singly or as combined.

Examples of the compound having an oxirane ring (epoxy compound) preferred for use in the invention include hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether; polyglycidyl ethers of polyether polyols produced by adding one or more alkylene oxides to aliphatic polyalcohol such as ethylene glycol, propylene glycol, glycerin or the like; diglycidyl esters of aliphatic long-chain dibasic acids; monoglycidyl ethers of aliphatic higher alcohols; monoglycidyl ethers of polyether alcohols produced by adding alkyleneoxide to phenol, cresol, butylphenol or the like; glycidyl esters of higher fatty acids, etc.

Of those, especially preferred are hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Commercial products favorable for use herein as the compound having a glycidyl group are UVR-6216 (by Union Carbide), Glycidol, AOEX24, Cyclomer A200 (all by Daicel Chemical Industry), Epikote 828, Epikote 812, Epikote 1031, Epikote 872, Epikote CT508 (all by Yuka Shell), KRM-2400, KRM-2410, KRM-2408, KRM-2490, KRM-2720, KRM-2750 (all by Asahi Denka Kogyo), etc. One or more of these may be used either singly or as combined.

The production method for the compounds having an oxirane ring is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262.

As said other polymerizable compound for use in the invention, vinyl ether compounds may be used. Any known vinyl ether compounds are usable, including, for example, 2-ethylhexyl vinyl ether, butanediol 1,4-divinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, etc.

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenoalkyl vinyl ether. One or more of these compounds may be used either singly or as combined.

For the purpose of enhancing the releasability from mold and the coatability of the composition, a compound having a fluorine atom may be incorporated into the composition. The compound includes, for example, trifluoromethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth)acrylate, tetrafluoropropyl (meth)acrylate, etc.

As said other polymerizable compound for use in the invention, propenyl ethers and butenyl ethers may also be employed. Preferred examples of the propenyl ethers and butenyl ethers include, for example, 1-dodecyl-1-propenyl ether, 1-dodecyl-1-butenyl ether, 1-butenoxymethyl-2-norbornene, 1,4-di(1-butenoxy)butane, 1,10-di(1-butenoxy)decane, 1,4-di(1-butenoxymethyl)cyclohexane, diethylene glycol di(1-butenyl) ether, 1,2,3-tri(1-butenoxy)propane, propenyl ether propylene carbonate, etc.

Preferable content of said other polymerizable compound varies depending on the content of the polymerizable compound (A1) having at least one of a fluorine atom and a silicon atom or a functional group. Said other polymerizable compound is contained, for example, in a range of from 0 to 99% by mass, preferably from 0 to 90% by mass, and more preferably from 0 to 70% by mass, of the total amount of all the polymerizable compounds contained in the composition of the invention.

(Polymerizable Compounds)

Preferable embodiments of the composition of the polymerizable compound (A) in the invention are described hereinafter.

A polymerizable compound having one polymerizable functional group (monofunctional polymerizable compound) is generally used as a reactive diluent, and has an effect of lowering the viscosity of the curable composition for imprints of the invention, and it is preferably added in an amount of from 0 to 90% by mass, more preferably from 0 to 70% by mass, and particularly preferably from 0 to 50% by mass, relative to the total amount of the polymerizable compounds.

A polymerizable compound having two polymerizable functional groups (difunctional polymerizable monomer) is added in an amount of preferably from 20 to 100% by mass, more preferably from 30 to 100% by mass, and particularly preferably 50 to 100% by mass, relative to the total amount of the polymerizable compounds.

The proportion of the monofunctional and difunctional polymerizable compounds to be added is preferably from 50 to 100% by mass, more preferably from 60 to 100% by mass, and particularly preferably from 70 to 100% by mass, relative to the total amount of the polymerizable compounds.

A polymerizable compound having three or more polymerizable functional groups is added in an amount of preferably at most 50% by mass, more preferably at most 40% by mass, and particularly preferably at most 30% by mass, relative to the total amount of the polymerizable compounds. When the polymerizable compound having three or more polymerizable functional groups is added in an amount of at most 50% by mass, the viscosity of the composition can be preferably reduced.

In the curable composition for imprints of the invention, 50% by mass or more of the polymerizable compound (A) is preferably a polyfunctional polymerizable compound having two or more polymerizable functional group in the molecule.

In the curable composition for imprints of the invention, 80% by mass or more of the polymerizable compound (A) is preferably a monomer having an aromatic group from the viewpoint of solvent resistance and dry etching resistance. More preferably 90% by mass or more, still more preferably 95% by mass or more of the polymerizable compound (A) is a monomer having an aromatic group.

In the curable composition for imprints of the invention, 20% by mass or more of the polymerizable compound (A) is preferably a polyfunctional polymerizable compound having two or more polymerizable functional group and an aromatic group in the molecule. More preferably 30% by mass or more, still more preferably 40% by mass or more, most preferably 50% by mass or more of the polymerizable compound (A) is a polyfunctional polymerizable compound having two or more polymerizable functional group and an aromatic group in the molecule.

In the curable composition for imprints of the invention, 90% by mass or more of the polymerizable compound (A) is preferably a polymerizable compound having a viscosity of 300 mPa·s or less, more preferably 100 mPa·s or less, particularly preferably 50 mPa·s or less from the viewpoint of patternability.

<Photopolymerization Initiator (B)>

The curable composition for imprints of the invention comprises a photopolymerization initiator (B). As the photopolymerization initiator in the invention, usable is any compound capable of generating an active radical for polymerization of the above-mentioned polymerizable monomer through photoirradiation. As the photopolymerization initiator, preferred are radical polymerization initiators. In the invention, two or more different types of photopolymerization initiators may be used, as combined.

The content of the photopolymerization initiator may be, for example, from 0.01 to 15% by mass of all the components constituting the composition except solvent, preferably from 0.1 to 12% by mass, more preferably from 0.2 to 7% by mass. In the case where two or more different types of photopolymerization initiators are used, the total amount thereof falls within the above range.

When the content of the photopolymerization initiator is at least 0.01% by mass, then it is favorable since the sensitivity (rapid curability), the power of resolution, the line edge accuracy and the coating film strength of the composition tend to be better. On the other hand, when the content of the photopolymerization initiator is at most 15% by mass, it is also favorable since the light transmittance, the discoloration resistance and the handlability of the composition tend to be better. Heretofore, inkjet compositions and compositions for liquid-crystal display color filters containing dye and/or pigments have been variously investigated in point of the preferred amount of the photopolymerization initiator and/or the photoacid generator to be in the compositions; however, there is no report relating to the preferred amount of the photopolymerization initiator and/or the photoacid generator to be added to curable compositions for imprints. In this connection, in the systems containing dye and/or pigment, the dye and/or the pigment may act as a radical-trapping agent and may have some influence on the photopolymerization and the sensitivity of the compositions. Taking this into consideration, the amount of the photopolymerization initiator to be added to these applications is optimized. On the other hand, in the composition for imprints of the invention, dye and/or pigment are not indispensable ingredients, and the optimum range of the photopolymerization initiator in the composition may differ from that in the field of inkjet compositions and compositions for liquid-crystal display color filters.

As the radical photopolymerization initiator for use in the invention, preferred are hydroxyacetophenone compounds, aminoacetophenone compounds, acylphosphine oxide compounds and oxime ester compounds, and more preferred are acylphosphine oxide compounds and oxime ester compounds from the viewpoint of the curing sensitivity and the absorption property of the composition. The radical photopolymerization initiator for use in the invention may be commercial products. Their examples are Irgacure® 2959 (1-[4-(2-hydroxyethoxy)phenyl]-2-hydroxy-2-methyl-1-propan-1-one), Irgacure® 184 (1-hydroxycyclohexyl phenyl ketone), Irgacure® 500 (1-hydroxycyclohexyl phenyl ketone, benzophenone), Irgacure® 651 (2,2-dimethoxy-1,2-diphenylethan-1-one), Irgacure® 369 (2-benzyl-2-dimethylamino-1-(4-morpholinophenyl)butanone-1), Irgacure® 907 (2-methyl-1[4-methylthiophenyl]-2-morpholinopropan-1-one), Irgacure® 819 (bis(2,4,6-trimethylbenzoyl)-phenylphosphine oxide), Irgacure® 1800 (bis(2,6-dimethoxybenzoyl)-2,4,4-trimethylpentylphosphine oxide, 1-hydroxycyclohexyl phenyl ketone), Irgacure® 1800 (bis (2,6-dimethoxybenzoyl)-2,4,4-trimethylpentylphosphine oxide, 2-hydroxy-2-methyl-1-phenyl-1-propan-1-one), Irgacure® OXE01 (1,2-octanedione, 1-[4-(phenylthio)phenyl]-2-(O-benzoyloxime)), Darocur® 1173 (2-hydroxy-2-methyl-1-phenyl-1-propan-1-one), Darocur® 1116, 1398, 1174 and 1020, CGI242 (ethanone, 1-[9-ethyl-6-(2-methylbenzoyl)-9H-carbazol-3-yl]-1-(O-acetyloxime)), which are all available from Ciba; Lucirin TPO (2,4,6-trimethylbenzoyldiphenylphosphine oxide), Lucirin TPO-L (2,4,6-trimethylbenzoylphenylethoxyphosphine oxide) which are both available from BASF; Esacure 1001M (1-[4-benzoylphenylsulfanyl]phenyl)-2-methyl-2-(4-methylphenylsulfonyl)propan-1-one available from Nihon SiberHegner; Adeka Optomer® N-1414 (carbazole/phenone compound), Adeka Optomer® N-1717 (acridine compound), Adeka Optomer® N-1606 (triazine compound), all available from Asahi Denka; Sanwa Chemical's TFE-triazine (2-[2-(furan-2-yl) vinyl]-4,6-bis(trichloromethyl)-1,3,5-triazine), Sanwa Chemical's TME-triazine (2-[2-(5-methylfuran-2-yl)vinyl]-4,6-bis(trichloromethyl)-1,3,5-triazine), Sanwa Chemical's MP-triazine (2-(4-methoxyphenyl)-4,6-bis(trichloromethyl)-1,3,5-triazine); Midori Chemical's TAZ-113 (2-[2-(3, 4-dimethoxyphenyl)ethenyl]-4,6-bis(trichloromethyl)-1,3, 5-triazine), Midori Chemical's TAZ-108 (2-(3,4-dimethoxyphenyl)-4,6-bis(trichloromethyl)-1,3,5-triazine; as well as benzophenone, 4,4'-bisdiethylaminobenzophenone, methyl-2-benzophenone, 4-benzoyl-4'-methyldiphenyl sulfide, 4-phenylbenzophenone, ethyl Michler's ketone, 2-chlorothioxanthone, 2-methylthioxanthone, 2-isopropylthioxanthone, 4-isopropylthioxanthone, 2,4-diethylthioxanthone, 1-chloro-4-propoxythioxanthone, 2-methylthioxanthone, thioxanthone ammonium salt, benzoin, 4,4'-dimethoxybenzoin, benzoin methyl ether, benzoin ethyl ether, benzoin isopropyl ether, benzoin isobutyl ether, benzyl dimethyl ketal, 1,1,1-trichloroacetophenone, diethoxyacetophenone, dibenzosuberone, methyl o-benzoylbenzoate, 2-benzoylnaphthalene, 4-benzoylbiphenyl, 4-benzoyldiphenyl ether, 1,4-benzoylbenzene, benzil, 10-butyl-2-chloroacridone, [4-(methylphenylthio)phenyl]phenylmethane), 2-ethylanthraquinone, 2,2-bis(2-chlorophenyl)-4,5,4',5'-tetrakis(3,4,5-trimethoxyphenyl)-1,2'-biimidazole, 2,2-bis(o-chlorophenyl)-4,5,4',5'-tetraphenyl-1,2'-biimidazole, tris(4-dimethylaminophenyl)methane, ethyl 4-(dimethylamino) benzoate, 2-(dimethylamino)ethyl benzoate, butoxyethyl 4-(dimethylamino)benzoate, etc.

In the invention, "light" includes not only those having with a wavelength falling within a range of ultraviolet, near-ultraviolet, far-ultraviolet, visible, infrared, and electromagnetic waves but also radiations. The radiations include, for example, microwaves, electron beams, EUV, X-rays. In addition, laser rays such as 248 nm excimer laser, 193 nm excimer laser, 172 nm excimer laser are also usable herein. These lights may be monochromatic lights (single wavelength lights) having passed through optical filters, or may be lights of different wavelengths (composite lights). For photoexposure, multiple photoexposure may be employable, and for the purpose of enhancing the film strength and the etching resistance of the composition, entire surface photoexposure may be effected after pattern formation.

(Other Ingredients)

The curable composition for imprints of the invention may contain any other ingredients than the above-mentioned polymerizable compound (A) and the photopolymerization initiator (B), in accordance with various purposes and not detracting from the effect of the invention. The additional ingredients include a surfactant, an antioxidant, a solvent, a polymer ingredient, a pigment, a dye, etc. Preferably, the curable composition for imprints of the invention contains at least one selected from a surfactant and an antioxidant.

—Surfactant—

Preferably, the curable composition for imprints of the invention comprises a surfactant. The content of the surfactant that may be in the composition may be, for example, from 0.001 to 5% by mass of the composition, preferably from 0.002 to 4% by mass, more preferably from 0.005 to 3% by mass. In the case where two or more different types of surfactants are in the composition, the total amount thereof falls within the above range. When the surfactant content in the composition falls from 0.001 to 5% by mass, it is favorable from the viewpoint of the coating uniformity, therefore hardly worsening the mold transferability owing to excessive surfactant.

As the surfactant, preferred are nonionic surfactants. Preferably, the composition comprises at least one of a fluorine-containing surfactant, a silicone-type surfactant and a fluorine-containing silicone-type surfactant. More preferably, the composition comprises both a fluorine-containing surfactant and a silicone-type surfactant, or a fluorine-containing silicone-type surfactant. The most preferably, the composition comprises a fluorine-containing silicone-type surfactant. As the fluorine-containing surfactant and the silicone-type surfactant, preferred are nonionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the composition of the invention in the cavity of a female mold, for enhancing the mold-resist releasability, for enhancing the resist adhesiveness to substrates, and for lowering the viscosity of the composition. In particular, when the above-mentioned surfactant is added to the composition for imprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include Fluorad FC-430, FC-431 (Sumitomo 3M's trade names); Surflon S-382 (Asahi Glass's trade name); Eftop EF-122A, 122B, 122C EF-121, EF-126, EF-127, MF-100 (Tochem Products' trade names); PF-636, PF-6320, PF-656, PF-6520 (Omnova Solution's trade names); Futagent FT250, FT251, DFX18 (Neos' trade names); Unidyne DS-401, DS-403, DS-451 (Daikin's trade names); Megafac 171, 172, 173, 178K, 178A, F780F (Dai-Nippon Ink's trade names).

Examples of the nonionic silicone-type surfactant include SI-10 series (Takemoto Yushi's trade name), Megafac Paintad 31 (Dai-Nippon Ink's trade name), KP-341 (Shin-Etsu Chemical's trade name).

Examples of the fluorine-containing silicone-type surfactant include X-70-090, X-70-091, X-70-092, X-70-093 (Shin-Etsu Chemical's trade names); Megafac R-08, XRB-4 (Dai-Nippon Ink's trade names).

—Antioxidant—

Preferably, the curable composition for imprints of the invention comprises a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by BASF); Antigene P, 3C, FR, Sumilizer S, Sumilizer GA80 (by Sumitomo Chemical); Adekastab AO70, AO80, AO503 (by Adeka), etc. These may be used either singly or as combined.

—Polymerization Inhibitor—

Furthermore, the curable composition for imprints of the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. Examples of the polymerization inhibitors include 4-methoxyphenol and hydroquinone.

—Solvent—

A solvent may be used for the curable composition for imprints of the invention, in accordance with various needs. The "solvent" here does not include the polymerizable compounds and compounds having at least one of the polymerizable functional groups. In particular, when a pattern having a thickness of at most 500 nm is formed, the composition preferably comprises a solvent. Preferably, the solvent has a boiling point at normal pressure of from 70 to 200° C. Regarding the type of the solvent, any solvent capable of dissolving the composition may be used. Preferable examples of the solvents include solvents having an ester structure, a ketone structure, a hydroxyl group, an ether structure. Preferred among them are solvents having at least any one of an ester structure, a ketone structure, a hydroxyl group and an ether structure in view of evenness of a coated thin layer. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the curable composition for imprints of the invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition, more preferably from 0 to 97% by mass. In forming a patter having a thickness of at most 500 nm by spin coating or other methods, the solvent content is preferably from 20 to 99% by mass, more preferably from 40 to 99% by mass, particularly preferably from 70 to 98% by mass.

Preferably, the curable composition for imprints of the invention does not substantially contain a solvent. The amount of solvent in the curable composition for imprints of the invention is preferably less than 1% by mass, more preferably 0.1% by mass, still more preferably 0.01% by mass, the most preferably 0% by mass.

—Polymer Ingredient—

The curable composition for imprints of the invention may comprise a polyfunctional oligomer as said other polymerizable compound having a larger molecular weight than that of the above-mentioned polyfunctional polymerizable compound within a range capable of attaining the object of the invention, for the purpose of further increasing the crosslinking density of the composition. Examples of the photoradical-polymerizable polyfunctional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition for imprints of the invention may comprise any other polymer ingredient for the purpose of enhancing the dry etching resistance, the imprint aptitude and the curability of the composition. The polymer ingredient is preferably a polymer having a polymerizable functional group in the side chain thereof. The weight-average molecular weight of the polymer ingredient is preferably from 2000 to 100000, more preferably from 5000 to 50000, from the viewpoint of the miscibility of the polymer with the polymerizable monomers constituting the composition. The amount of the polymer ingredient to be added may be preferably from 0 to 30% by mass of the composition except the solvent therein, more preferably from 0 to 20% by mass, even more preferably from 0 to 10% by mass, most preferably at most 2% by mass. When the content of the compound having a molecular weight of at least 2000 in the composition of the invention is at most 30% by mass of the composition except the solvent therein, then the patternability of the composition is bettered. From the viewpoint of the patternability of the composition, the content of such compound is preferably as small as possible, and except for the surfactant and other minor additives, preferably, the composition does not comprise any additional resin ingredient.

In addition to the above-mentioned ingredients, the curable composition for imprints of the invention may comprise, if desired, release agent, silane coupling agent, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

(Process for Preparing the Curable Composition for Imprints)

The curable composition for imprints of the invention may be produced by mixing the above-mentioned ingredients. The ingredients for the curable composition are generally mixed and dissolved at a temperature falling within a range of from 0° C. to 100° C. After the ingredients are mixed, the resulting mixture is preferably filtered through a filter having a pore size of from 0.003 μm to 5.0 μm. The filtration may be effected in two or more stages, or may be repeated two or more times. The solution once filtered may be again filtered. Not specifically defined, the material of the filter may be any one, for example, polyethylene resin, polypropylene resin, fluororesin, nylon resin, etc.

(Properties of Curable Composition for Imprints)

Preferably, the viscosity of the mixture of all the ingredients except the solvent of the curable composition for imprints of the invention is at most 100 mPa·s, more preferably from 1 to 70 mPa·s, even more preferably from 2 to 50 mPa·s, most preferably from 3 to 30 mPa·s.

The curable composition for imprints of the invention can form a micropattern at low cost and with high accuracy according to a photonanoimprinting method using it. Therefore, the composition can form the same pattern as that formed through conventional photolithography with a further higher degree of accuracy at a lower cost. For example, when the composition of the invention is applied onto a substrate or a support and the resulting layer of the composition is exposed to light, cured and optionally dried (baked), then a permanent film of an overcoat layer or an insulating layer for use in liquid-crystal displays (LCD) may be formed, or the composition may be used as an etching resist in producing semiconductor integrated circuits, recording materials, flat panel displays, etc.

Regarding the permanent film (resist in structure parts) for use in liquid-crystal displays (LCD) or the resist for use in substrate processing for electronic materials, it is desirable that the resist is prevented as much as possible from being contaminated with metal or organic ionic impurity in order not to inhibit the movement of the devices. Therefore, in the curable composition for imprints of the invention, the metal or organic ionic impurity concentration is preferably at most 1000 ppm, more preferably at most 10 ppm, even more preferably at most 100 ppb.

[Patterning Method]

The patterning method (especially micropatterning method) of using the curable composition for imprints of the invention is described below. The patterning method of the invention comprises a step of applying the curable composition for imprints of the invention onto a substrate (this term in the specification includes a base and a support) to form a patterning layer thereon, a step of pressing a mold against the surface of the patterning layer, and a step of irradiating the patterning layer with light to cure the curable composition of the invention whereby a micropattern can be formed.

The curable composition for imprints of the invention may be cured by heating after the irradiation with light. More specifically, A composition for a pattern forming layer containing the composition of the invention is provided on a substrate (a base or a support) and optionally dried to form a layer composed of the composition of the invention (pattern forming layer) whereby a pattern receiving element having the patterning layer on the substrate is obtained. A mold is pressed on the surface of the patterning layer on the pattern receiving element and treated to transfer the mold pattern, and then the patterning layer having a micropattern is cured by irradiation with light. The photoimprint lithography in accordance with the patterning method of the invention can be applied to lamination and multipatterning and can be used with a normal thermal imprinting in combination.

Hereinafter, the patterning method using the curable composition for imprints of the invention (pattern transferring method) will be specifically described.

In the patterning method of the invention, the composition of the invention is first provided (preferably coated) onto the substrate to form a patterning layer.

The method for providing the curable composition for imprints of the invention onto a substrate may be a well known providing method and generally a coating method can be used.

As the method for providing the curable composition for imprints of the invention, a dip coating method, an air knife coating method, a curtain coating method, a wire bar coating method, a gravure coating method, an extrusion coating method, a spin coating method, a slit scanning method, an inkjet method, etc can be used to form a coated membrane or liquid particles on the substrate. Particularly preferred are a spin coating method and an inkjet method. The thickness of the patterning method of the composition of the invention may vary depending on the use thereof, and may be from 0.03 μm to 30 μm or so. The composition of the invention may be applied in a mode of multilayer coating. In the inkjet method and the like, the amount of a liquid particle provided on the substrate is preferably about 1 pl to about 20 pl. Between the substrate and the patterning method of the composition of the invention, any other organic layer may be formed, such as a planarizing layer, etc. With that, the patterning layer is not kept in direct contact with the substrate, and therefore, the substrate may be prevented from being contaminated with dust or from being scratched. The pattern to be formed of the composition of the invention may have good adhesiveness to the organic layer, if any, formed on the substrate.

The substrate (base or support) to which the curable composition for imprints of the invention is applied may be selected from various materials depending on its use, including, for example, quartz, glass, optical film, ceramic material, vapor deposition film, magnetic film, reflective film, metal substrate of Ni, Cu, Cr, Fe or the like, paper, SOG (spin on glass), polymer substrate such as polyester film, polycarbonate film or polyimide film, TFT array substrate, PDP electrode plate, glass or transparent plastic substrate, electroconductive substrate of ITO, metal or the like, insulating substrate, semiconductor substrate such as silicon, silicon nitride, polysilicon, silicon oxide or amorphous silicon, which, however, are not limitative. The shape of the substrate is not also specifically defined. It may be tabular or roll. As described below, the substrate may be light-transmissive or non-light-transmissive, depending on the combination thereof with a mold.

Next, in the patterning method of the invention, a mold is pressed against the surface of the patterning layer in order to transfer the pattern onto the patterning layer whereby a micropattern formed on the pressing surface of the mold can be transferred to the patterning layer.

The composition of the invention can be used to form the pattern on the mold and it can be pressed on the surface of the patterning layer in a substrate.

The mold material usable in the invention is described. In the photoimprint lithography with the composition of the invention, a light-transmissive material is selected for at least one of the mold material and/or the substrate. In the photoimprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for imprints of the invention is provided onto a light-transmissive substrate, then a mold is pressed against it, and this is irradiated with light from the back of the substrate whereby the curable composition for imprints of the invention can be cured.

The irradiation with light can be conducted on the state where the mold is kept in contact or after the mold is released. In the invention, the irradiation is preferably conducted on the state where the mold is kept in contact.

As the mold that can be used in the invention, a mold having a transferable pattern formed thereon is used. The pattern on the mold may be formed, for example, through photolithography, electronic beam lithography, or the like according to the desired processing accuracy, but in the invention, the mold patterning method is not specifically defined.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold that can be used in the invention when a light-transmissive mold material is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold that can be used in the patterning method of the invention may be subjected to release treatment for the purpose of further enhancing the releasability of the curable composition for imprint of the invention from the surface of the mold. Such a release treatment of the mold includes, for example, a treatment by a silicone-based, fluorine-based, or other type of silane coupling agent. Further, for example, commercial release agents such as Optool DSX manufactured by Daikin Industries, Ltd., Novec EGC-1720 manufactured by Sumitomo 3M Limited, and the like can be suitably used for the release treatment of the mold.

In the case where the photoimprint lithography is performed using the composition of the invention, the patterning method of the invention is generally preferably performed at a mold pressure of 10 MPa or less. By setting the mold pressure at 10 MPa or less, the mold and the substrate become hard to deform and the patterning accuracy tends to increase. Furthermore, since the applied pressure is low, the device tends to be small-sized and thereby preferable. The mold pressure is preferably determined so that the residual film of the composition for imprints in the mold projections can be reduced, and thus the uniformity in the mold transfer is ensured.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition and on the tackiness of the cured film as previously determined.

In the photoimprint lithography applied to the invention, the substrate temperature in photoirradiation may be room temperature; however, the photoirradiation may be attained under heat for enhancing the reactivity. In the previous stage of photoirradiation, preferably, the system is kept in vacuum as effective for preventing contamination with bubbles or contamination with oxygen or for preventing the reduction in reactivity, and as effective for enhancing the adhesiveness of the curable composition with mold. The system may be subjected to photoirradiation while still kept in vacuum. In the patterning method of the invention, the vacuum degree in photoirradiation is preferably from $10^{-1}$ Pa to ordinary pressure.

Light to be used for photoirradiation to cure the composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 100 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

[Pattern]

The pattern thus formed according to the patterning method of the invention as described in the above can be used as a permanent film (resist for structural members) for use in liquid-crystal displays (LCD) and others, or as an etching resist. After its production, the permanent film may be bottled in a container such as a gallon bottle or a coated bottle, and may be transported or stored. In this case, the container may be purged with an inert gas such as nitrogen, argon or the like for preventing the composition therein from being degraded. The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

The pattern formed from the curable composition for imprints of the invention is characterized by showing a high solvent resistance. Preferable curable composition for imprints of the invention shows a high resistance to a various kinds of solvents. Particularly preferable curable composition for imprints of the invention maintains its thickness after immersed for 10 minutes in a solvent used in a general process for producing a substrate, such as an N-methylpyrrolidone solvent, at 25° C.

The pattern formed by the patterning method of the invention is useful as an etching resist. In the case where the curable composition for imprints of the invention is sued as an etching resist, first, the composition of the invention is applied onto a substrate, for example, a silicon wafer or the like with a thin film of $SiO_2$ or the like formed thereon, and patterned according to the patterning method of the invention to thereby form a nano-order micropattern on the substrate. Subsequently, this is wet-etched with hydrogen fluoride or the like, or dry-etched with an etching gas such as $CF_4$ or the like, thereby forming a desired pattern on the substrate. Preferably, the curable composition for imprints of the invention has good etching resistance in dry etching with carbon fluoride or the like.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

(Preparation of Curable Composition for Imprints)

Examples 1 to 20 Comparative Examples 1 to 3

To the polymerizable compound shown in Table 3 below, added were the following polymerization initiator P-1 (2% by mass), the following surfactant W-1 (0.1% by mass), the following surfactant W-2 (0.04% by mass), the following antioxidant A-1 (1% by mass) and the following antioxidant A-2 (1% by mass). Further, as a polymerization initiator, 4-methoxyphenol was added thereto as so controlled that its amount could be 200 ppm relative to all the polymerizable compound. This was filtered through a 0.1-μm tetrafluoroethylene-made filter to prepare a curable composition for imprints. In Table 3, the ingredients are in a ratio by mass.

Details of the polymerizable monomers used in the Examples and Comparative Examples are shown below:

TABLE 1

| | Polymerizable compound (A1) having at least one of a fluorine atom and a silicon atom |
|---|---|
| A1A | perfluorohexylethyl acylate (CHEMINOX FAAC-6 by Unimatec) |
| A1B | 2,2,3,3,4,4,5,5-octafluoro-1,6-hexyl diacrylate (by SynQuest) |
| A1C | polymer produced by the synthetic method below |
| A1D | 3-[tris(trimethylsilyloxy)silyl]propyl metacrylate (by Tokyo Kasei) |
| A1E | [structure shown] |

The viscosity of A1A, A1B and A1D at 25° C. is each at most 50 mPa·s. A1C is a solid at 25° C. A1E is waxy at 25° C.

(Production of Polymer (A1C))

Methyl ethyl ketone (4.2 g) was put into a three-neck flask and heated in a nitrogen current atmosphere at 80° C. To this was dropwise added a solution prepared by dissolving tridecafluorooctyl methacrylate (4.5 g), 4-tert-butylcyclohexyl methacrylate (3.9 g), the Compound 1 below (synthesized from hydroxyethyl methacrylate and bromoisbutyroyl chloride, 2.0 g) and a polymerization initiator (Wako Pure Chemical's V-601) (0.48 g) in methyl ethyl ketone (38 g), taking 4 hours. After the addition, this was reacted at 80° C. for 3 hours to give Polymer 2 below. To the solution, added was diazabicycloundecene (3.2 g) and reacted at room temperature for 10 hours. The reaction liquid was poured into water/methanol (10/90) (500 ml), and the resulting powder was collected through filtration, washed and dried to give a polymer (A1C) (8.7 g). Its molecular weight was measured through GPC. As a result, the weight-average molecular weight of the polymer in terms of standard polystyrene was 12000, and the degree of dispersion thereof was 1.9.

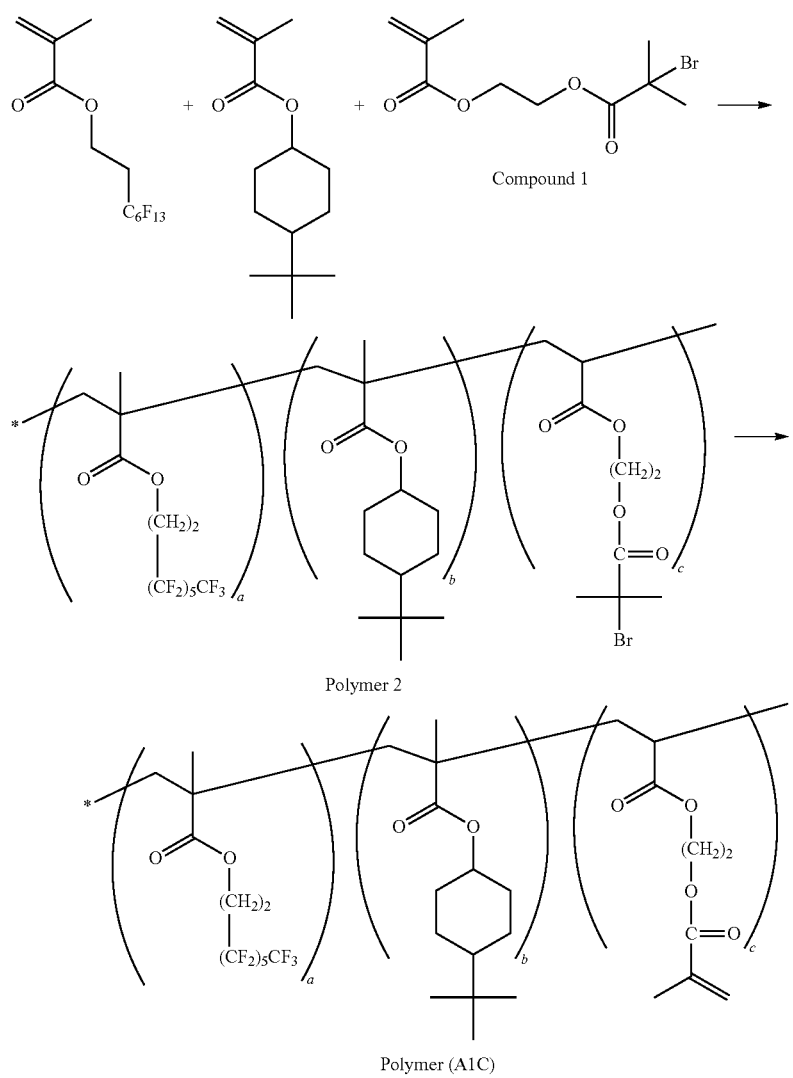

Polymer (A1C)

In the formula, a/b/c=30/50/20. In the polymer 2 and the polymer (A1C), a, b and c each indicate the ratio of the corresponding recurring unit, totaling 100%.

(Production of Polymerizable Monomer (A1E))

Dithioerythritol (2 g) was dissolved in ethyl acetate (20 ml), and triethylamine (0.2 g) and perfluorohexylethyl acrylate (11.4 g) were added to the solution. The mixture was reacted at a room temperature for 4 hours. Triethylamine (4.0 g) and ethyl acetate (20 ml) were added to the reaction mixture, and then acrylic chloride (2.9 g) was dropped thereto with cooling by ice. After completion of the dropping, the mixture was reacted at a room temperature for 20 hours and then water (50 ml) was added thereto and stirred. The organic phase was washed with 1N aqueous solution of hydrochloric acid, saturated aqueous solution of sodium hydrogen carbonate and saturated aqueous solution of sodium chloride, and dried for concentration to obtain a crude product. The crude product was purified by column chromatography to obtain polymerizable monomer (A1E) (3 g).

$^1$H-NMR (CDCl$_3$): δ2.4-3.0 (m, 16H), δ4.4 (t, 4H), δ5.4 (m, 2H), δ5.9 (d, 2H), δ6.1 (dd, 2H), δ6.45 (d, 2H)

TABLE 2

| | Polymerizable compound (A2) having an aromatic group | viscosity at 25° C. [mPa · s] |
|---|---|---|
| R-1 | benzyl acrylate (Biscoat #160, by Osaka Organic Chemical) | 2.3 |
| R-2 | 2-Naphthylmethyl acrylate (produced from 2-bromomethylnaphthalene and acrylic acid in an ordinary method) | 10.8 |
| R-3 | M-xylylene diacrylate (produced from α,α'-dichloro-m-xylene and acrylic acid in an ordinary method) | 9.7 |
| R-4 | Etoxybisphenol A diacrylate (NK ester A-BPE-10, by Shin-Nakamura Chemical) | 550 |

TABLE 3

| | Other polymerizable compound | viscosity at 25° C. [mPa · s] |
|---|---|---|
| R-5 | isoboronyl acrylate (IBXA, by Osaka Organic Chemical) | 10.7 |

TABLE 3-continued

|  | Other polymerizable compound | viscosity at 25° C. [mPa · s] |
|---|---|---|
| R-6 | neopentylglycol diacrylate (Kayarad NPGDA, by Nippon Kayaku) | 5.7 |

<Photopolymerization Initiator>
P-1: 2,4,6-Trimethylbenzoyl-ethoxyphenyl-phosphine oxide (Lucirin TPO-L, by BASF).
<Surfactant>
W-1: Fluorosurfactant (Tochem Products' fluorosurfactant).
W-2: Silicone surfactant (Dai-Nippon Ink Chemical Industry's Megafac Paintad 31).
<Antioxidant>
A-1: Sumilizer GA80 (by Sumitomo Chemical Industry).
A-2: Adekastab A0503 (by ADEKA).
(Evaluation)

Thus produced, the curable compositions of Examples and Comparative Examples were evaluated as follows. The results are shown in Table 3 below.
<Patternability Evaluation>

The curable composition prepared in the above was applied onto a silicon substrate in a mode of spin coating. 20 coated sample sheets were thus produced for one and the same sample composition. On the coated sample sheet, a quartz mold was put, of which the surface had a rectangular line/space pattern (1/1) having a line width of 40 nm and a groove depth of 80 nm and of which the patterned surface had been processed with a silane coupling agent having a perfluoropolyether structure (Daikin Industry's Optool DSX); and this was set in a nanoimprinting apparatus. The apparatus was vacuumed and then purged with nitrogen whereby the apparatus had a nitrogen atmosphere inside it. At 25° C. and under a pressure of 0.5 MPa, the mold was pressed against the substrate, and the substrate was exposed to light from the back thereof at 240 mJ/cm$^2$. After the exposure, the mold was released to give a pattern. Using the same mold, 20 coated samples were successively processed without cleaning for pattern transferring thereonto with regard to each Example and Comparative Example. The pattern formed in the 1st-run transfer and the pattern formed in the 20th-run transfer were observed with a scanning microscope and checked for the region with no mold pattern reproduction failure such as pattern peeling, cracking or crushing.
A: No pattern deficiency was seen at all.
B: The pattern partly had a deficiency, which was 10% or less of the total pattern area.
C: The pattern had a deficiency, which was more than 10% of the total pattern area.
<Test for Solvent Resistance>

Each composition was applied onto a glass substrate in a mode of spin coating, thereby forming a coating film having a thickness of 1.0 μm. Not pressed against a mold, this was exposed to light in a nitrogen atmosphere at a dose of 240 mJ/cm$^2$, and then heated in an oven at 230° C. for 30 minutes thereby forming a cured film. This was dipped in a solvent of N-methylpyrrolidone at 25° C. for 10 minutes, and before and after dipping, the cured film was checked for the thickness change, as follows. The samples having a smaller film thickness change have better solvent resistance.
A: Thickness change, less than 1%.
B: Thickness change, from 1% to less than 3%.
C: Thickness change, from 3% to less than 10%.
D: Surface roughened.

TABLE 4

| | Polymerizable compounds Components (part by mass) | | | | | | | | | | | |
|---|---|---|---|---|---|---|---|---|---|---|---|---|
| | Polymerizable compound having at least one of fluorine atom and silicon atom (A1) | | | | | | Polymerizable compound having an aromatic group (A2) | | | | Other polymerizable compound | |
| | A1A | A1B | A1C | A1D | A1E | fluorine content | R-1 | R-2 | R-3 | R-4 | R-5 | R-6 |
| Example 1 | 1 | 0 | 0 | 0 | 0 | 59% | 0 | 0 | 0 | 10 | 59 | 30 |
| Example 2 | 1 | 0 | 0 | 0 | 0 | 59% | 0 | 0 | 0 | 5 | 59 | 35 |
| Example 3 | 1 | 0 | 0 | 0 | 0 | 59% | 0 | 0 | 0 | 10 | 49 | 40 |
| Example 4 | 1 | 0 | 0 | 0 | 0 | 59% | 0 | 0 | 0 | 20 | 59 | 20 |
| Example 5 | 1 | 0 | 0 | 0 | 0 | 59% | 75 | 0 | 0 | 10 | 0 | 14 |
| Example 6 | 1 | 0 | 0 | 0 | 0 | 59% | 0 | 45 | 15 | 0 | 0 | 39 |
| Example 7 | 1 | 0 | 0 | 0 | 0 | 59% | 0 | 46 | 44 | 9 | 0 | 0 |
| Example 8 | 1 | 0 | 0 | 0 | 0 | 59% | 0 | 59 | 0 | 0 | 0 | 40 |
| Example 9 | 1 | 0 | 0 | 0 | 0 | 59% | 59 | 0 | 40 | 0 | 0 | 0 |
| Example 10 | 1 | 0 | 0 | 0 | 0 | 59% | 49 | 0 | 50 | 0 | 0 | 0 |
| Example 11 | 1 | 0 | 0 | 0 | 0 | 59% | 19 | 0 | 80 | 0 | 0 | 0 |
| Example 12 | 1 | 0 | 0 | 0 | 0 | 59% | 0 | 0 | 99 | 0 | 0 | 0 |
| Example 13 | 1 | 0 | 0 | 0 | 0 | 59% | 0 | 49 | 50 | 0 | 0 | 0 |
| Example 14 | 3 | 0 | 0 | 0 | 0 | 59% | 47 | 0 | 50 | 0 | 0 | 0 |
| Example 15 | 0 | 1 | 0 | 0 | 0 | 41% | 49 | 0 | 50 | 0 | 0 | 0 |
| Example 16 | 0 | 0 | 1 | 0 | 0 | 25% | 49 | 0 | 50 | 0 | 0 | 0 |
| Example 17 | 0 | 0 | 0 | 1 | 0 | 0% | 49 | 0 | 50 | 0 | 0 | 0 |
| Example 18 | 0 | 0 | 0 | 0 | 1 | 45% | 0 | 49 | 50 | 0 | 0 | 0 |
| Example 19 | 0 | 0 | 0 | 0 | 0.5 | 45% | 0 | 49.5 | 50 | 0 | 0 | 0 |
| Example 20 | 0 | 0 | 0 | 0 | 0.5 | 45% | 0 | 70 | 29.5 | 0 | 0 | 0 |
| Comparative Example 1 | 1 | 0 | 0 | 0 | 0 | 59% | 0 | 0 | 0 | 0 | 49 | 50 |
| Comparative Example 2 | 0 | 0 | 0 | 0 | 0 | 0% | 0 | 0 | 0 | 0 | 50 | 50 |

TABLE 4-continued

| | | | | | | Polymerizable compounds Content (%) | | | | | | |
|---|---|---|---|---|---|---|---|---|---|---|---|---|
| Comparative Example 3 | 0 | 0 | 0 | 0 | 0 | 0% | 50 | 0 | 50 | 0 | 0 | 0 |

| | Total of polyfunctional polymerizable compounds | Total of polyfunctional polymerizable compounds having an aromatic group | Total of polymerizable compounds having an aromatic group | Total of polmerizable compounds having a viscosity of 300 mPa·s or less | Evaluation of composition | | |
|---|---|---|---|---|---|---|---|
| | | | | | Patternability | | Solvent Resistance |
| | | | | | 1st-run | 20th-run | |
| Example 1 | 40.0 | 10.0 | 10.0 | 90.0 | A | B | B |
| Example 2 | 40.0 | 5.0 | 5.0 | 95.0 | A | B | B |
| Example 3 | 50.0 | 10.0 | 10.0 | 90.0 | A | B | A |
| Example 4 | 40.0 | 20.0 | 20.0 | 80.0 | A | B | A |
| Example 5 | 24.0 | 10.0 | 85.0 | 90.0 | A | A | B |
| Example 6 | 54.0 | 15.0 | 60.0 | 100.0 | A | B | A |
| Example 7 | 53.0 | 53.0 | 99.0 | 91.0 | A | A | A |
| Example 8 | 40.0 | 0.0 | 59.0 | 100.0 | A | B | B |
| Example 9 | 40.0 | 40.0 | 99.0 | 100.0 | A | A | B |
| Example 10 | 50.0 | 50.0 | 99.0 | 100.0 | A | A | A |
| Example 11 | 80.0 | 80.0 | 99.0 | 100.0 | A | A | A |
| Example 12 | 99.0 | 99.0 | 99.0 | 100.0 | A | A | A |
| Example 13 | 50.0 | 50.0 | 99.0 | 100.0 | A | A | A |
| Example 14 | 50.0 | 50.0 | 97.0 | 100.0 | A | A | A |
| Example 15 | 50.0 | 50.0 | 99.0 | 100.0 | A | B | A |
| Example 16 | 50.0 | 50.0 | 99.0 | 100.0 | A | A | A |
| Example 17 | 50.0 | 50.0 | 99.0 | 100.0 | A | B | A |
| Example 18 | 50.0 | 50.0 | 99.0 | 99.0 | A | A | A |
| Example 19 | 50.5 | 50.0 | 99.5 | 99.5 | A | A | A |
| Example 20 | 30.0 | 29.5 | 99.5 | 99.5 | A | A | B |
| Comparative Example 1 | 50.0 | 0.0 | 0.0 | 100.0 | A | B | C |
| Comparative Example 2 | 50.0 | 0.0 | 0.0 | 100.0 | A | C | C |
| Comparative Example 3 | 50.0 | 50.0 | 100.0 | 100.0 | A | C | B |

The patternability of the composition in Examples 1 to 20 was further evaluated by the same way as the above patternability evaluation except that the spin coating method is replaced by the following inkjet method. Square dot array of 10 pl droplets with 200 μm pitch was printed on each of the samples with an inkjet dispensing apparatus manufactured by Fujifilm Dimatix and the subsequent process was the same as the above patternability evaluation. Like the spin coating method, good patternability was observed in the inkjet method.

In Examples using the curable composition for imprints of the invention, the patternability was good in repeated pattern transferring and solvent resistance was also good. On the other hand, the compositions of Comparative Examples 2 and 3 having no polymerizable compound having at least one of a fluorine atom and a silicon atom showed inferior patternability in repeated pattern transferring. The compositions of Comparative Examples 1 and 2 having no polymerizable compound having an aromatic group showed inferior solvent resistance. Particularly, the composition of Comparative Examples 2 having neither of the polymerizable compounds showed inferior patternability in repeated pattern transferring and inferior solvent resistance.

The invention claimed is:

1. A curable composition for imprints, comprising (A) a polymerizable compound and (B) a photopolymerization initiator, wherein:
   the polymerizable compound (A) comprises (A1) a polymerizable compound having at least one of a fluorine atom and a silicon atom and (A2) a polymerizable compound having an aromatic group;
   the polymerizable compound (A2) having an aromatic group is an acrylate or a methacrylate; and
   the polymerizable compound (A1) having at least one of a fluorine atom and a silicon atom has a partial structure of the following formula (II):

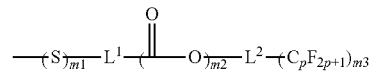

wherein $L^1$ represents an alkylene group having from 1 to 8 carbon atoms; $L^2$ represents a linking group; m1 indicates 0 or 1, m2 indicates 1; m3 indicates an integer of from 1 to 3; p indicates an integer of from 1 to 8; and when m3 is 2 or more, $(-C_pF_{2p+1})$'s may be the same or different.

2. The curable composition for imprints according to claim 1, wherein 20% by mass or more of the polymerizable compound (A) is a polyfunctional polymerizable compound having two or more polymerizable functional groups and an aromatic group in the molecule.

3. The curable composition for imprints according to claim 1, wherein more than 90% by mass of the polymerizable compound (A) is a polymerizable compound having a viscosity of 300 mPa·s or less.

4. The curable composition for imprints according to claim 1, wherein 80% by mass or more of the polymerizable compound (A) is a monomer having an aromatic group.

5. The curable composition for imprints according to claim 1, wherein the polymerizable compound (A1) having at least one of a fluorine atom and a silicon atom is a polymerizable compound having a trifluoromethyl group structure.

6. The curable composition for imprints according to claim 1, wherein the polymerizable compound (A1) having at least one of a fluorine atom and a silicon atom is a polymerizable compound having two or more fluorine-containing groups in a molecule.

7. The curable composition for imprints according to claim 1, wherein the polymerizable compound (A1) having at least one of a fluorine atom and a silicon atom is a polymerizable compound having a fluorine content of from 20 to 60% by mass.

8. The curable composition for imprints according to claim 1, wherein the polymerizable compound (A1) having at least one of a fluorine atom and a silicon atom is a polymer having a fluorine atom and having a weight average molecular weight of from 2000 to 100000.

9. The curable composition for imprints according to claim 1, wherein the polymerizable compound (A1) having at least one of a fluorine atom and a silicon atom is a monomer having a silicon atom.

10. The curable composition for imprints according to claim 1, wherein the polymerizable compound (A2) having an aromatic group has a molecular weight of from 150 to 500.

11. The curable composition for imprints according to claim 1, wherein the polymerizable compound (A2) having an aromatic group has a viscosity of from 2 to 300 mPa·s.

12. The curable composition for imprints according to claim 1, wherein the polymerizable compound (A2) having an aromatic group is contained in an amount of 80% by mass or more in all the polymerizable compounds contained in the curable composition.

13. A patterning method comprising:
applying the curable composition for imprints according to claim 1 onto a substrate to form a patterning layer thereon,
pressing a mold against the surface of the patterning layer, and
irradiating the patterning layer with light.

14. A pattern formed according to the patterning method of claim 13.

15. The curable composition for imprints according to claim 1, wherein 50% by mass or more of the polymerizable compound (A) is a polyfunctional polymerizable compound having two or more polymerizable functional groups in the molecule.

16. A curable composition for imprints, comprising (A) a polymerizable compound and (B) a photopolymerization initiator, wherein:
the polymerizable compound (A) comprises (A1) a polymerizable compound having at least one of a fluorine atom and a silicon atom and (A2) a polymerizable compound having an aromatic group;
the polymerizable compound (A2) having an aromatic group is an acrylate or a methacrylate; and
the polymerizable compound (A1) having at least one of a fluorine atom and a silicon atom is represented by the following formula (III):

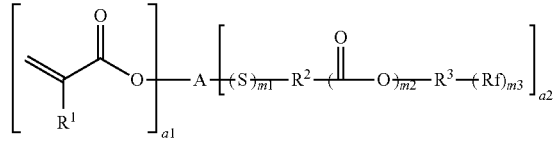

wherein $R^1$ represents a hydrogen atom, an alkyl group, a halogen atom or a cyano group; A represents an (a1+a2)-valent linking group; a1 indicates an integer of from 1 to 6; a2 indicates an integer of from 2 to 6; $R^2$ represents an alkylene group having from 1 to 8 carbon atoms; $R^3$ represents a linking group; Rf represents a fluoroalkyl group or a fluoroalkyl ether group; m1 indicates 0 or 1; m2 indicates 1; m3 indicates an integer of from 1 to 3; when a1 is 2 or more, each $R^1$ may be the same or different; when a2 is 2 or more, each $R^2$, $R^3$, m1, m2 and m3 may be the same or different; and when m3 is 2 or more, each Rf may be the same or different.

* * * * *